US012795903B2

(12) United States Patent
Yoon et al.

(10) Patent No.: US 12,795,903 B2
(45) Date of Patent: Nov. 10, 2026

(54) INTEGRATED CIRCUIT DEVICES AND RELATED SELF-ALIGNING PROCESSES

(71) Applicant: Samsung Electronics Co., Ltd., Suwon-si (KR)

(72) Inventors: Chansic Yoon, Suwon-si (KR); Jongmin Kim, Suwon-si (KR); Kiseok Lee, Suwon-si (KR); Junhyeok Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 428 days.

(21) Appl. No.: 18/335,186

(22) Filed: Jun. 15, 2023

(65) Prior Publication Data

US 2024/0032286 A1 Jan. 25, 2024

(30) Foreign Application Priority Data

Jul. 22, 2022 (KR) ........................ 10-2022-0091322

(51) Int. Cl.
*H10B 12/00* (2023.01)
*H10D 64/27* (2025.01)

(52) U.S. Cl.
CPC ......... *H10B 12/488* (2023.02); *H10B 12/315* (2023.02); *H10B 12/482* (2023.02); *H10B 12/485* (2023.02); *H10D 64/512* (2025.01)

(58) Field of Classification Search
CPC ............. H10B 12/0335; H10B 12/053; H10B 12/315; H10B 12/34; H10B 12/48; H10B 12/482; H10B 12/485; H10B 12/488; H10B 12/50; H10D 64/512
See application file for complete search history.

(56) References Cited

U.S. PATENT DOCUMENTS 8,048,737 B2 11/2011 Kim et al.
8,846,472 B2 9/2014 Yi
9,184,227 B1 11/2015 Kim et al.
9,520,348 B2 12/2016 Choi et al.
2005/0017295 A1* 1/2005 Kim .................. H10W 20/0698 257/E21.507
2015/0380508 A1 12/2015 Kim et al.
(Continued)

FOREIGN PATENT DOCUMENTS

KR 20110024494 A 3/2011
KR 20110101924 A 9/2011
(Continued)

*Primary Examiner* — Hoai V Pham
(74) *Attorney, Agent, or Firm* — Wolf, Greenfield & Sacks, P.C.

(57) ABSTRACT

Provided is an integrated circuit device including a substrate that includes an active region defined by a trench isolation, a word line that extends in a first horizontal direction inside the substrate across the active region, a bit line that extends on the word line in a second horizontal direction orthogonal to the first horizontal direction, a direct contact that electrically connects the bit line to the active region, a pad that is on the active region and has a horizontal width that is greater than that of the active region, a buried contact that contacts a sidewall of the pad, and a conductive landing pad that extends on the buried contact in a vertical direction and faces the bit line in the first horizontal direction.

13 Claims, 36 Drawing Sheets

II-II'

(56) References Cited

U.S. PATENT DOCUMENTS

| | | | | |
|---|---|---|---|---|
| 2020/0118929 | A1 | 4/2020 | Kim et al. | |
| 2022/0165657 | A1 | 5/2022 | Park et al. | |
| 2023/0035899 | A1 * | 2/2023 | Lee ...................... | H10B 12/315 |

FOREIGN PATENT DOCUMENTS

| | | | |
|---|---|---|---|
| KR | 20120122640 | A | 11/2012 |
| KR | 102000136 | B1 | 7/2019 |
| KR | 10-2019-0112443 | A | 10/2019 |
| KR | 10-2022-0047547 | A | 4/2022 |
| KR | 20220162019 | A | 12/2022 |
| TW | 202221893 | A | 6/2022 |
| TW | 202221894 | A | 6/2022 |

* cited by examiner

II-II'

II-II'

II-II'

I-I'

II-II'

I-I'

II-II'

I-I'

II-II'

I-I'

II-II'

I-I'

II-II'

I-I'

II-II'

I-I'

II-II'

I-I'

I-I'

II-II'

I-I'

II-II'

INTEGRATED CIRCUIT DEVICES AND RELATED SELF-ALIGNING PROCESSES

CROSS-REFERENCE TO RELATED APPLICATION

This application is based on and claims priority under 35 U.S.C. § 119 to Korean Patent Application No. 10-2022-0091322, filed on Jul. 22, 2022, in the Korean Intellectual Property Office, the disclosure of which is incorporated by reference herein in its entirety.

BACKGROUND

Aspects of the inventive concept relate to integrated circuit devices, and more particularly, to integrated circuit devices including a structure formed in a self-aligning manner.

With the rapid development of the electronics industry and the demands of users, electronic devices have become smaller and lighter. Thus, high-integration integrated circuit devices used in electronic devices can be necessary, reducing the design rules for configurations of the integrated circuit devices. As a result, the difficulty of a manufacturing process for increasing a contact area between conductive patterns constituting an integrated circuit device is gradually increasing.

SUMMARY

Aspects of the inventive concept may provide integrated circuits that include an additional pad formed in a self-aligning manner on an active region to secure a contact area between a buried contact and the active region.

The technical problems of the inventive concept are not limited to the technical problems mentioned above, and other technical problems not mentioned will be clearly understood by those of ordinary skill in the art from the description provided below.

According to some aspects of the inventive concept, there is provided an integrated circuit device including a substrate that includes an active region defined by a trench isolation, a word line that extends in a first horizontal direction inside the substrate across the active region, a bit line that extends on the word line in a second horizontal direction orthogonal to the first horizontal direction, a direct contact that electrically connects the bit line to the active region, a pad that is on the active region and has a horizontal width that is greater than that of the active region, a buried contact that contacts a sidewall of the pad, and a conductive landing pad that extends on the buried contact in a vertical direction and faces the bit line in the first horizontal direction.

According to some aspects of the inventive concept, there is provided an integrated circuit device including a substrate that includes an active region defined by a trench isolation, a word line that extends in a first horizontal direction inside the substrate across the active region, a bit line that extends on the word line in a second horizontal direction orthogonal to the first horizontal direction, a direct contact that electrically connects the bit line to the active region, a pad that is on the active region and has a horizontal width that is less than that of the active region, a spacer on opposing sidewalls of the pad, a buried contact that contacts a first sidewall of the opposing sidewalls of the pad and a portion of the spacer, and a conductive landing pad that extends on the buried contact in a vertical direction and faces the bit line in the first horizontal direction.

According to some aspects of the inventive concept, there is provided an integrated circuit device including a substrate that includes an active region defined by a trench isolation, a pad that is on the active region and has a horizontal width that is different from that of the active region, a word line that extends in a first horizontal direction inside the substrate across the active region, a bit line that extends on the word line in a second horizontal direction orthogonal to the first horizontal direction, a direct contact that electrically connects the bit line to the active region, a conductive landing pad that faces the bit line in the first horizontal direction, a capacitor structure on the bit line and electrically connected to the conductive landing pad, and a buried contact that contacts a sidewall of the pad such that the capacitor structure is electrically connected to the active region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

Figure 1:
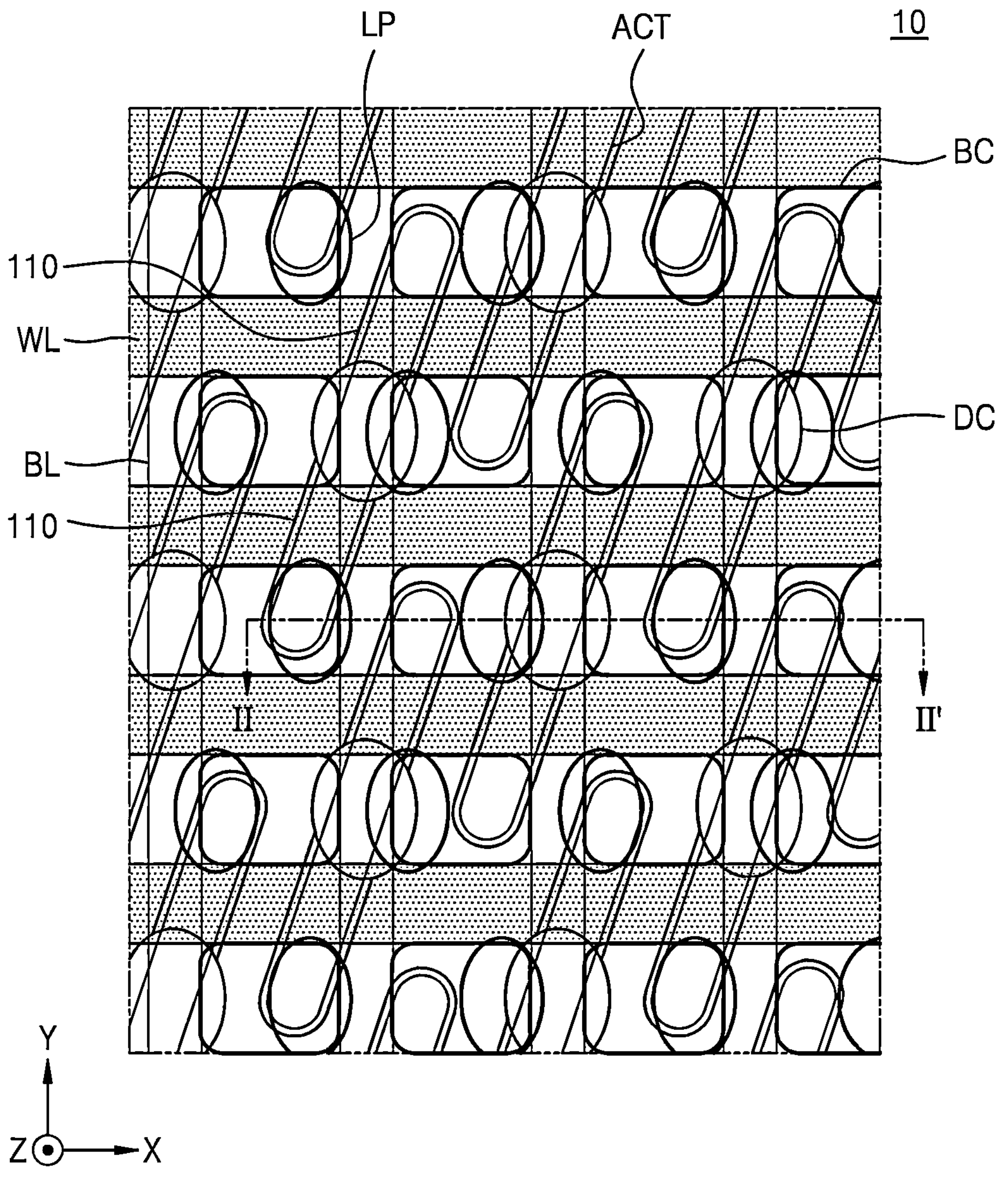
FIG. 1 is a layout view showing an integrated circuit device, according to some example embodiments of the inventive concept.

FIG. 1 is a layout view showing an integrated circuit device, according to some example embodiments of the inventive concept.

Referring to FIG. 1, an integrated circuit device 10 may include a plurality of active regions ACT arranged to have a major axis in a diagonal direction with respect to a first horizontal direction (an X direction) and a second horizontal direction (a Y direction).

A plurality of word lines WL may extend in parallel with one another in the first horizontal direction (the X direction) across the plurality of active regions ACT. On the plurality of word lines WL, a plurality of bit lines BL may extend in parallel with one another in the second horizontal direction (the Y direction) that intersects with the first horizontal direction (the X direction).

The plurality of bit lines BL may be respectively connected to the plurality of active regions ACT through a direct contact DC. In some embodiments, a plurality of buried contacts BC may be formed between two bit lines BL adjacent to each other among the plurality of bit lines BL. The plurality of buried contacts BC may respectively extend to an upper portion of any one of two adjacent bit lines BL. In some embodiments, the plurality of buried contacts BC may be arranged in a line in the first horizontal direction (the X direction) and the second horizontal direction (the Y direction).

A plurality of landing pads LP may be respectively formed on the plurality of buried contacts BC. The plurality of buried contacts BC and the plurality of landing pads LP may connect a lower electrode (not shown) of a capacitor formed on the plurality of bit lines BL to the plurality of active regions ACT. The plurality of landing pads LP may be arranged to partially overlap with the plurality of buried contacts BC, respectively. A detailed description will be made below.

Figure 2:
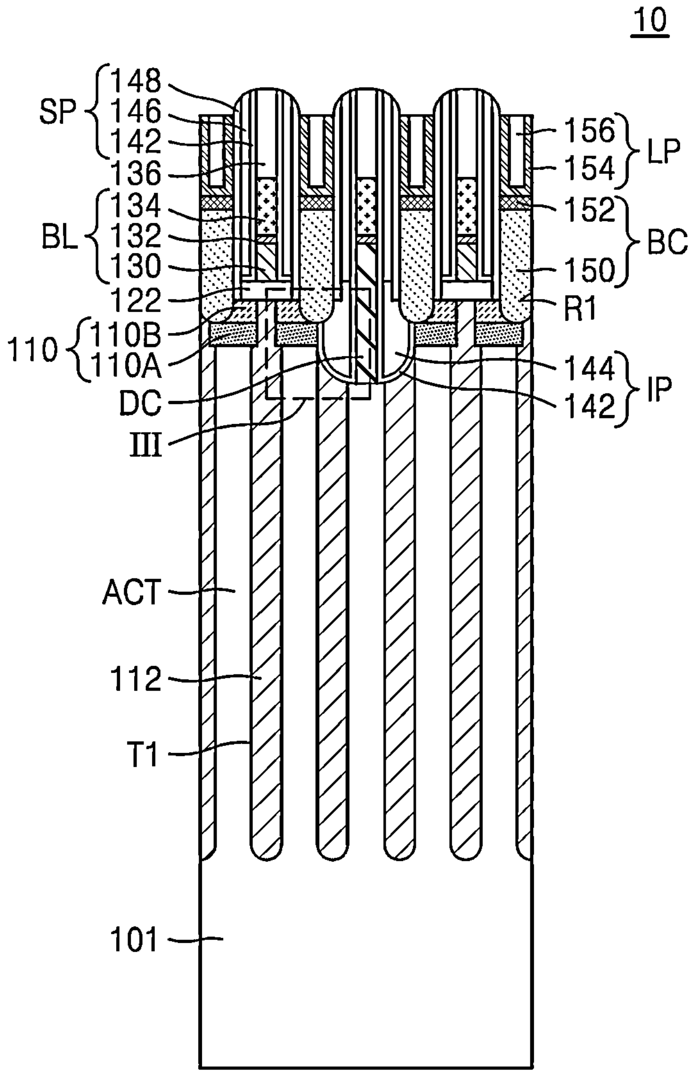
FIG. 2 is a cross-sectional view showing an integrated circuit device, according to some example embodiments of the inventive concept.

FIG. 2 is a cross-sectional view showing an integrated circuit device, according to some example embodiments of the inventive concept.

Figure 3:
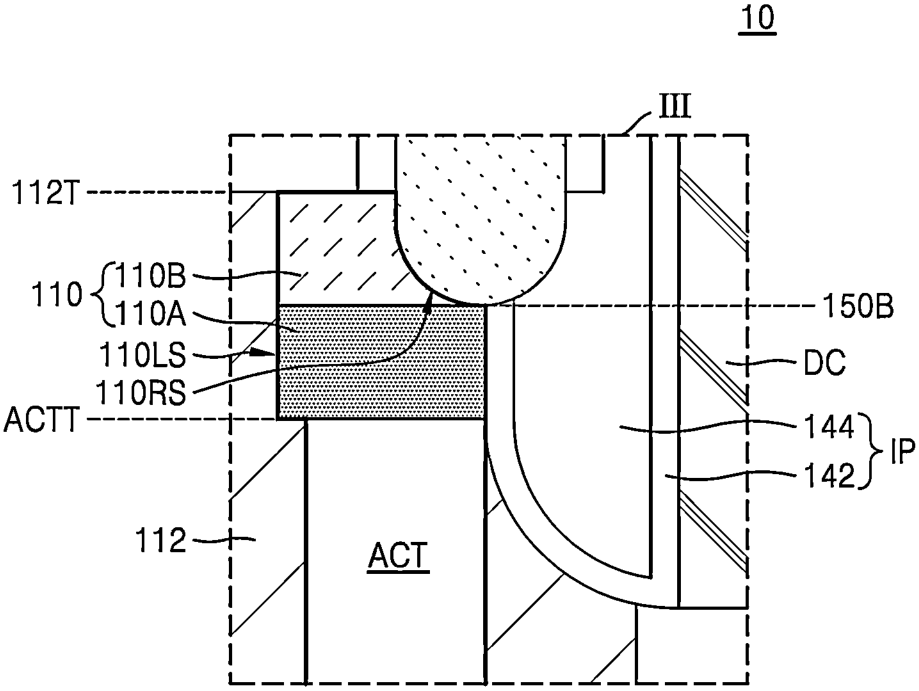
FIG. 3 is an enlarged view of a portion III of FIG. 2, according to some example embodiments of the inventive concept.

More specifically, FIG. 2 is a cross-sectional view taken along a position corresponding to a line II-II' of FIG. 1, and FIG. 3 is an enlarged view of a portion III of FIG. 2.

Referring to FIGS. 2 and 3 together, the integrated circuit device 10 may include a substrate 101 on which the plurality of active regions ACT are defined by a trench isolation 112.

The substrate 101 may be a wafer including silicon (Si). Alternatively, the substrate 101 may be a wafer including a semiconductor element, such as germanium (Ge), or a compound semiconductor, such as silicon carbide (SiC), gallium arsenide (GaAs), indium arsenide (InAs), and/or indium phosphide (InP). Meanwhile, the substrate 101 may have a silicon-on-insulator (SOI) structure. The substrate 101 may include a conductive region, for example, an impurity-doped well or an impurity-doped structure.

The trench isolation 112 may be formed in a first trench T1 formed in the substrate 101. The trench isolation 112 may include a silicon oxide, a silicon nitride, or a combination thereof. On the substrate 101, the plurality of active regions ACT may be defined by the trench isolation 112.

The plurality of active regions ACT may be arranged in the form or shape of a bar extending in the diagonal direction with respect to the first horizontal direction (the X direction) and the second horizontal direction (the Y direction). On each of the plurality of active regions ACT, an additional pad 110 having a greater horizontal width than the active region ACT may be arranged. A detailed description thereof will be made later.

The plurality of word lines WL described above with reference to FIG. 1 may be buried in the substrate 101. On the substrate 101, a buffer layer 122 may be formed. The buffer layer 122 may cover a top surface of the additional pad 110 and a top surface of the trench isolation 112. The buffer layer 122 may include, but is not limited to, a stacked structure of a first silicon oxide, a silicon nitride, and a second silicon oxide that are sequentially formed on the substrate 101. As used herein, “an element A and an element B are sequentially formed on an element X” (or similar language) may mean that the element A and the element B are stacked on the element X.

The plurality of bit lines BL extending in parallel with one another in the second horizontal direction (the Y direction) may be arranged on the buffer layer 122. The plurality of bit lines BL may be separated from one another in the first horizontal direction (the X direction). The direct contact DC may be arranged on a partial region of each of the plurality of active regions ACT. Each of the plurality of bit lines BL may be connected to the active region ACT through the direct contact DC. The direct contact DC may include, for example, W, WN, Co, Ni, Al, Mo, Ru, Ti, TiN, Ta, TaN, Cu, or a combination thereof. In some embodiments, the direct contact DC may include doped polysilicon.

Each of the plurality of bit lines BL may include a lower conductive layer 130, an intermediate conductive layer 132, and an upper conductive layer 134 that are sequentially formed on the substrate 101. A top surface of each of the plurality of bit lines BL may be covered with an insulating capping pattern 136. The insulating capping pattern 136 may be arranged on the upper conductive layer 134. A top surface of the lower conductive layer 130 of the bit line BL and a top surface of the direct contact DC may be arranged on the same plane (e.g., may be coplanar).

In some embodiments, the lower conductive layer 130 may include doped polysilicon. Each of the intermediate conductive layer 132 and the upper conductive layer 134 may include a film including Ti, TiN, TiSiN, W, WN, WSi, WSiN, Ru, or a combination thereof. For example, the intermediate conductive layer 132 may include a TiN and/or TiSiN film, and the upper conductive layer 134 may include a film including Ti, TiN, W, WN, WSiN, Ru, or a combination thereof. The insulating capping pattern 136 may include a silicon nitride.

A plurality of recess spaces R1 may be formed in the active region ACT in a partial region of the substrate 101. The plurality of recess spaces R1 may be respectively filled with a plurality of contact plugs 150. The plurality of contact plugs 150 may have a column shape extending in a vertical direction (a Z direction) from each recess space R1. Each of the plurality of contact plugs 150 may contact the active region ACT. A lower end portion of each of the plurality of contact plugs 150 may be arranged at a lower level than a top surface of the substrate 101 so as to be buried in the substrate 101. The plurality of contact plugs 150 may be entirely formed of metal, a metal and metal silicide film, or doped polysilicon, without being limited thereto.

In the integrated circuit device 10 according to some embodiments of the inventive concept, one direct contact DC and a pair of contact plugs 150 facing each other with the one direct contact DC therebetween may be electrically connected to different active regions ACT among the plurality of active regions ACT through the additional pad 110. That is, the contact plug 150 may be directly connected to the active region ACT while forming a contact surface with the additional pad 110 having a greater horizontal width than the active region ACT.

The plurality of contact plugs 150 may be arranged in a line in the second horizontal direction (the Y direction) between a pair of bit lines BL that are selected from among the plurality of bit lines BL and are adjacent to each other. An insulating fence (not shown) may be arranged between the plurality of contact plugs 150 arranged in a line in the second horizontal direction (the Y direction). The plurality of contact plugs 150 may be insulated from one another by the insulating fence. For example, the insulating fence may include a silicon nitride. The insulating fence may have a column shape extending in the vertical direction (the Z direction) on the substrate 101.

A plurality of metal silicide films 152 and the plurality of landing pads LP may be respectively arranged on the plurality of contact plugs 150. Each of the plurality of landing pads LP may extend longitudinally in the vertical direction (the Z direction) on the contact plug 150. The plurality of landing pads LP may be electrically connected to the plurality of contact plugs 150, respectively, through the metal silicide films 152.

Each of the plurality of landing pads LP may include a conductive barrier film 154 and a metal film 156. In some embodiments, the conductive barrier film 154 may include Ti, TiN, or a combination thereof, and the metal film 156 may include tungsten (W). The plurality of landing pads LP may have the shape of a plurality of island patterns, when viewed from a plan view. In some embodiments, the metal silicide film 152 may include, but is not limited to, cobalt silicide, nickel silicide, or manganese silicide. In some embodiments, the metal silicide film 152 may be omitted.

The contact plug 150 and the metal silicide film 152 may constitute a buried contact BC. The contact plug 150, the metal silicide film 152, and the landing pad LP may be sequentially arranged on the substrate 101 and may constitute a contact structure electrically connected to the active region ACT through the additional pad 110 in a position adjacent to the bit line BL in the first horizontal direction (the X direction).

The plurality of bit lines BL and both sidewalls of each of the plurality of insulating capping patterns 136 covering the top surfaces of the plurality of bit lines BL may be covered with a spacer structure SP. One spacer structure SP may be between one bit line BL selected from among the plurality of bit lines BL and the plurality of contact plugs 150 arranged in a line in the second horizontal direction (the Y direction) in a position adjacent to the bit line BL. Each of the plurality of spacer structures SP may include an inner spacer 142, an intermediate spacer 146, and an outer spacer 148.

The inner spacer 142 may adjoin a sidewall of the bit line BL and a sidewall of the direct contact DC. The inner spacer 142 may include a portion adjoining the contact plug 150. The inner spacer 142 may include a silicon nitride.

The intermediate spacer 146 may be between the inner spacer 142 and the outer spacer 148 in the first horizontal direction (the X direction). The intermediate spacer 146 may include sidewalls facing the bit line BL with the inner spacer 142 therebetween and sidewalls facing the contact plug 150, the metal silicide film 152, and the landing pad LP with the outer spacer 148 therebetween. The intermediate spacer 146 may include a silicon oxide, an air spacer, or a combination thereof.

The outer spacer 148 may adjoin a sidewall of each of the contact plug 150, the metal silicide film 152, and the landing pad LP. The outer spacer 148 may be spaced apart from the inner spacer 142, having the intermediate spacer 146 therebetween. In some embodiments, the outer spacer 148 may include a silicon nitride.

The spacer structure SP may extend in parallel with the bit line BL in the second horizontal direction (the Y direction). The insulating capping pattern 136 and the spacer structure SP may include an insulating structure covering the top surface and both sidewalls of the bit line BL.

A gap-fill pattern 144 may be between the direct contact DC and the contact plug 150. The gap-fill pattern 144 may be spaced apart from the direct contact DC, having the inner spacer 142 therebetween. The gap-fill pattern 144 may enclose the direct contact DC while covering sidewalls of the direct contact DC. The gap-fill pattern 144 may adjoin the inner spacer 142 and the contact plug 150. In some embodiments, the gap-fill pattern 144 may include a silicon nitride. A structure including the inner spacer 142 and the gap-fill pattern 144 may be referred to as an insulating pattern IP.

Although not shown, a plurality of capacitors may be arranged on the plurality of landing pads LP. The plurality of capacitors may include a plurality of lower electrodes, a capacitor dielectric film, and an upper electrode. The capacitor dielectric film may cover the plurality of lower electrodes. The upper electrode may cover the capacitor dielectric film and face the plurality of lower electrodes having the capacitor dielectric film therebetween.

Recently, a design rule for components of an integrated circuit device has been sharply reduced. Thus, in a general integrated circuit device, to increase a contact area between an active region with a sharply reduced size and a buried contact, a recess space may be formed by using a combination of an anisotropic etching process and an isotropic etching process. Such etching processes may increase a difficulty of a manufacturing process in a dynamic random access memory (DRAM) semiconductor having a buried cell array transistor (BCAT). Moreover, the contact area may be insufficient merely with the recess space, and thus, introduction of an additional component may be required due to a difficulty in electrical connection.

In the integrated circuit device 10 according to some embodiments, the additional pad 110 having the greater horizontal width than the active region ACT may be formed on the active region ACT in a self-aligning manner. In addition, the additional pads 110 may be arranged to be spaced apart from each other at opposite ends of the active region ACT in the shape of a bar. Similar to the active region ACT, in a plan view, the additional pad 110 may be formed in the shape of a bar extending in the diagonal direction with respect to the first horizontal direction (the X direction) and the second horizontal direction (the Y direction). Through the additional pad 110, a contact area between the active region ACT and the buried contact BC may be efficiently secured. In other words, a contact area between the additional pad 110 electrically connected to the active region ACT and the contact plug 150 forming the buried contact BC may be increased.

More specifically, the contact plug 150 may be formed to penetrate or extend into a sidewall 110RS of the additional pad 110. Thus, at least a portion of the sidewall 110RS that the contact plug 150 contacts may have a round (e.g., concave) shape in the additional pad 110, and the other sidewall 110LS that the contact plug 150 does not contact may have a vertical shape (e.g., may have an unrounded shape or a linear shape) in the additional pad 110. Moreover, as described above, the insulating pattern IP may be arranged to surround both sidewalls of the direct contact DC, and the insulating pattern IP may contact the sidewall 110RS of the additional pad 110.

In some embodiments, a level of a lowermost surface 150B of the contact plug 150 may be higher than that of a lowermost surface of the additional pad 110 and may be lower than a level of an uppermost surface of the additional pad 110. As used herein, "a level of an element X may be lower/higher than a level of an element Y" (or similar language) may mean that the level of the element X may be lower/higher in the vertical direction (the Z direction) than the level of the element Y. The level of the lowermost surface 150B of the contact plug 150 may be higher than that of an uppermost surface ACTT of the active region ACT and may be lower than that of an uppermost surface 112T of the trench isolation 112. That is, the contact plug 150 may be electrically connected to the active region ACT through the additional pad 110 without directly contacting the active region ACT.

In the integrated circuit device 10 according to some embodiments, the additional pad 110 may have a stacked structure of a lower pad 110A including doped polysilicon and an upper pad 110B including metal. Herein, the contact plug 150 may include metal that is substantially the same as the upper pad 110B. In some embodiments, the contact plug 150 may directly contact the upper pad 110B, and in this case, the contact plug 150 and the upper pad 110B may include the same material, and thus, a resistance of contact therebetween may be low.

In some embodiments, the additional pad 110 may further include a metal silicide film (not shown) between the lower pad 110A and the upper pad 110B. In addition, the contact plug 150 may further include a metal silicide film (not shown) along a contact surface contacting the upper pad 110B. However, the additional pad 110 and the contact plug 150 are not limited thereto.

In the integrated circuit device 10 according to some embodiments, as will be described later, a process of forming the additional pad 110 may use a self-aligning manner without using photolithography, thereby forming the additional pad 110 having a small size with uniform distribution without adding a manufacturing process.

Hence, by including the additional pad 110 formed in the self-aligning manner on the active region ACT, the integrated circuit device 10 according to some embodiments of the inventive concept may secure a contact area between the buried contact BC and the active region ACT, thereby maintaining production efficiency and stable operation performance.

Figure 4:
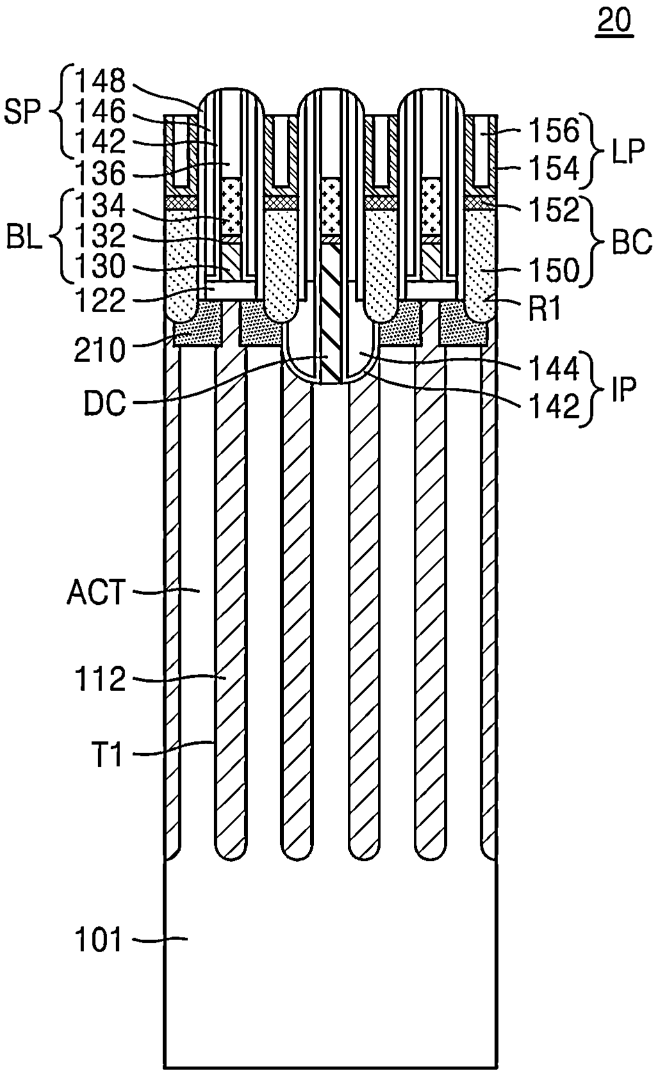
FIGS. 4 and 5 are cross-sectional views showing an integrated circuit device, according to some example embodiments of the inventive concept.
Figure 5:
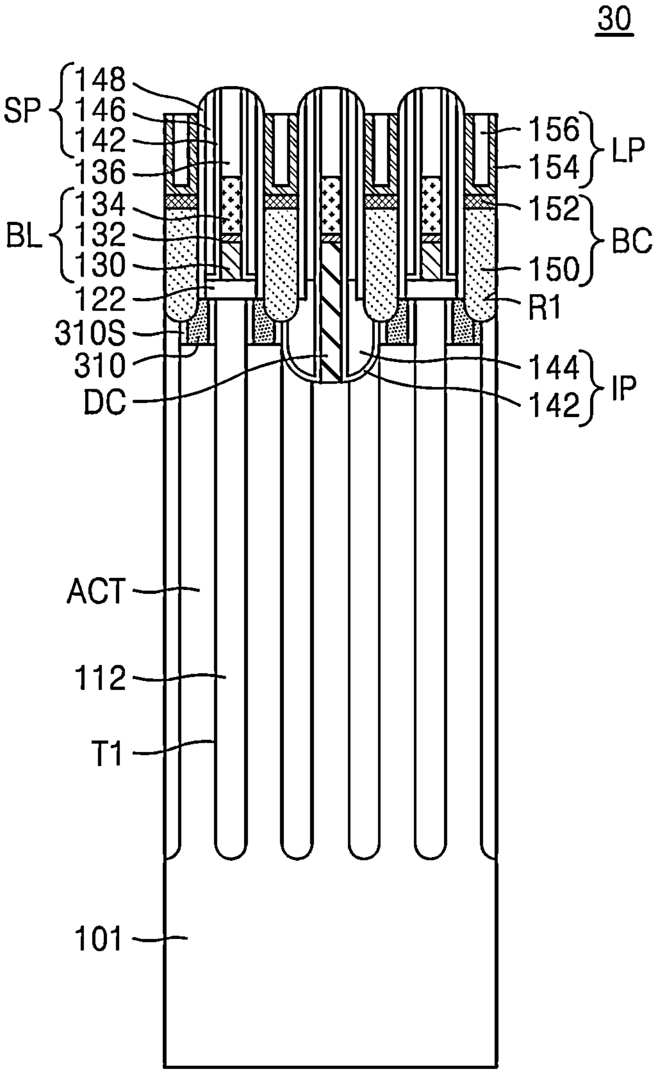

FIGS. 4 and 5 are cross-sectional views showing an integrated circuit device according to some example embodiments of the inventive concept.

Some components of integrated circuit devices 20 and 30 and materials forming the components described below may be substantially the same as or similar with those described above with reference to FIG. 2. Thus, for convenience of description, differences with the integrated circuit device 10 described above will be mainly described below.

Referring to FIG. 4, the integrated circuit device 20 may include an additional pad 210 having a single-layer structure.

In some embodiments, the additional pad 210 may include a single-layer structure of doped polysilicon. In this case, the plurality of contact plugs 150 may entirely include doped polysilicon, without being limited thereto.

In other embodiments, the additional pad 210 may include a single-layer structure of metal. In this case, the plurality of contact plugs 150 may entirely include metal, without being limited thereto.

In the integrated circuit device 20 according to some embodiments, the contact plug 150 may directly contact the additional pad 210, and in this case, the contact plug 150 and the additional pad 210 may include the same material, and thus, a resistance of contact therebetween may be low.

Referring to FIG. 5, an integrated circuit device 30 may include an additional pad 310 having a horizontal width that is less than that of the active region ACT.

The integrated circuit device 30 according to some embodiments may further include the additional pad 310 having the horizontal width that is less than that of the active region ACT and an additional spacer 310S formed on both sidewalls of the additional pad 310. Thus, the contact plug 150 may be formed to penetrate or extend into a sidewall of the additional pad 310 and a portion of the additional spacer 310S.

More specifically, at least a portion of the sidewall may have a round (e.g., concave) shape in the additional pad 310, and a top surface of the additional spacer 310S contacting the sidewall of the additional pad 310 may have a round (e.g., concave) shape. For example, at least a portion of the sidewall of the additional pad 310 contacting the contact plug 150 may have a round (e.g., concave) shape, and the top surface of the additional spacer 310S contacting the contact plug 150 may have a round (e.g., concave) shape. The other sidewall opposing the sidewall may have a vertical shape (e.g., may have an unrounded shape or a linear shape) in the additional pad 310, and the top surface of the additional spacer 310S contacting the other sidewall of the additional pad 310 may have a plane or planar shape. For example, the sidewall of the additional pad 310 not contacting the contact plug 150 may have a vertical shape (e.g., may have an unrounded shape or a linear shape), and the top surface of the additional spacer 310S not contacting the contact plug 150 may have a plane or planar shape (e.g., may have an unrounded shape).

In some embodiments, the insulating pattern IP surrounding both sidewalls of the direct contact DC may contact the additional spacer 310S and may not contact the additional pad 310. Moreover, the level of the lowermost surface of the contact plug 150 may be higher than those of lowermost surfaces of the additional pad 310 and the additional spacer 310S and may be lower than those of uppermost surfaces of the additional pad 310 and the additional spacer 310S.

FIGS. 6A to 15C are views presented in a processing order to describe a method of manufacturing an integrated circuit device, according to some example embodiments of the inventive concept.

More specifically, FIGS. 6A, 7A, 8A, 9A, 10A, 11A, 12A, 13A, 14A, and 15A are plan views shown in a processing order to describe a method of manufacturing an integrated circuit device. FIGS. 6B, 7B, 8B, 9B, 10B, 11B, 12B, 13B, 14B, and 15B are cross-sectional views taken along positions corresponding to lines I-I' of FIGS. 6A, 7A, 8A, 9A, 10A, 11A, 12A, 13A, 14A, and 15A, respectively. FIGS. 6C, 7C, 8C, 9C, 10C, 11C, 12C, 13C, 14C, and 15C are cross-sectional views taken along positions corresponding to lines II-II' of FIGS. 6A, 7A, 8A, 9A, 10A, 11A, 12A, 13A, 14A, and 15A, respectively.

Figure 6A:
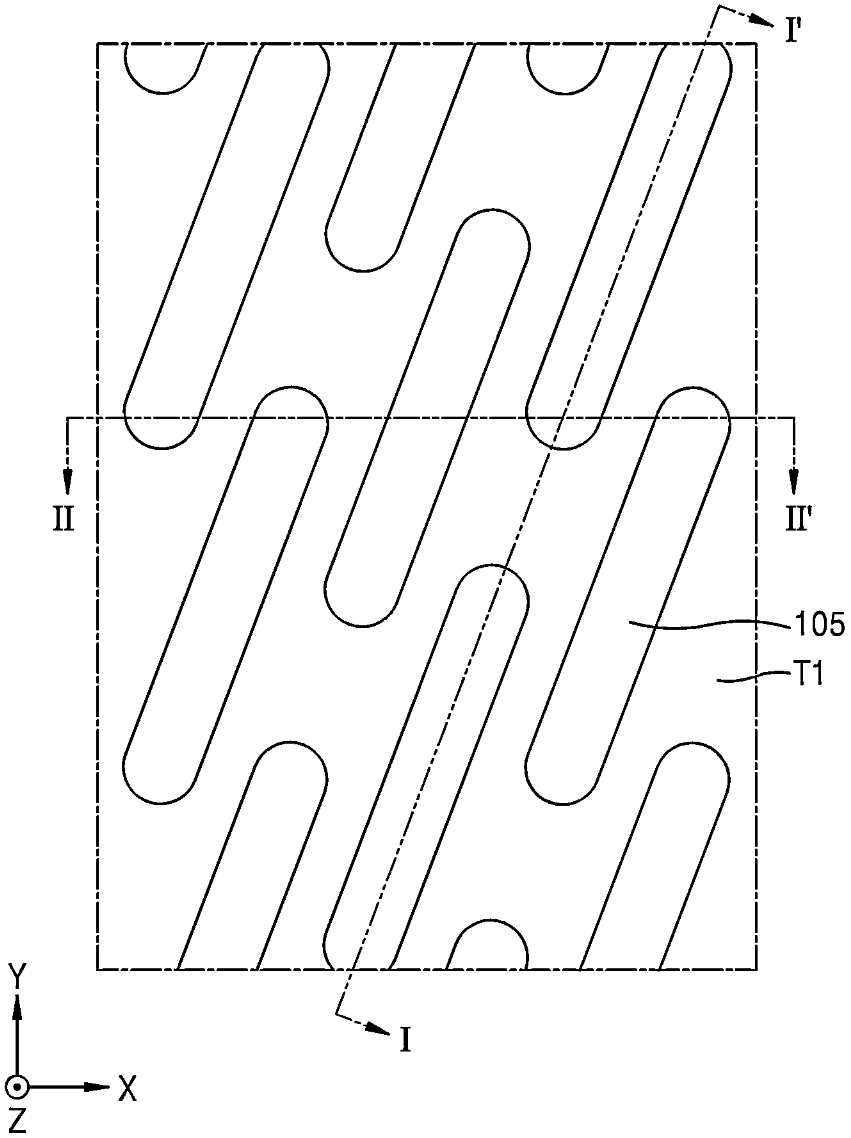
FIGS. 6A-6C, 7A-7C, 8A-8C, 9A-9C, 10A-10C, 11A-11C, 12A-12C, 13A-13C, 14A-14C, and 15A-15C are views presented in a processing order to describe a method of manufacturing an integrated circuit device, according to some example embodiments of the inventive concept.
Figure 6B:
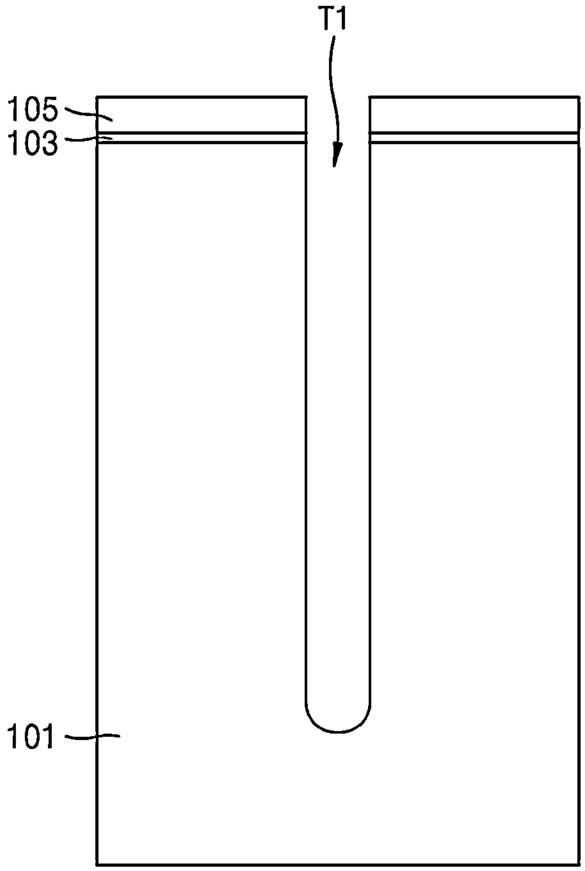
Figure 6C:
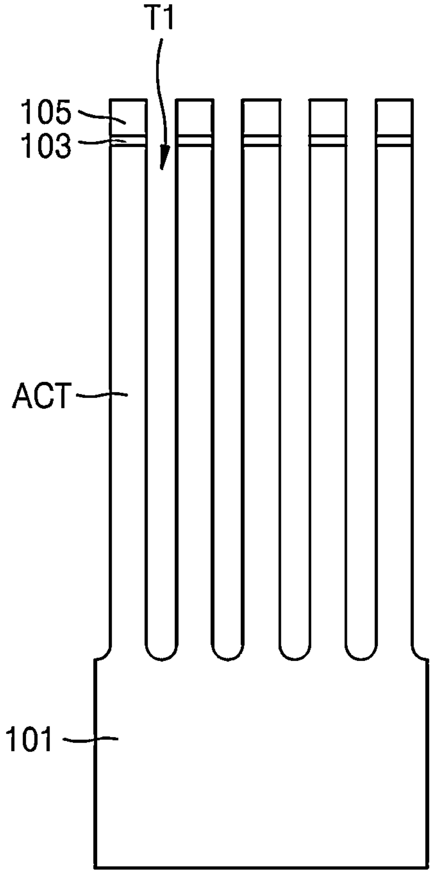

Referring to FIGS. 6A, 6B, and 6C together, a first mask 105 may be formed on the substrate 101 through photolithography, and a first trench T1 may be formed using the first mask 105.

The first mask 105 may include a plurality of bar shapes extending in the diagonal direction with respect to the first horizontal direction (the X direction) and the second horizontal direction (the Y direction). Such a shape of the first mask 105 may correspond to a planar shape of the active region ACT. The first mask 105 may include an insulating material. For example, the first mask 105 may include SiN, SiO, SiON, SiOC, and/or a metal oxide or a combination thereof.

Before the first mask 105 is formed, a protection insulating film 103 may be formed on a top surface of the substrate 101. The protection insulating film 103 may protect the substrate 101 or the active region ACT from an external foreign substance, etc. The protection insulating film 103 may serve as an etching stopping film in an etching process with respect to a material film of a different type in a subsequent process. The first mask 105 may be formed on the protection insulating film 103, and the first trench T1 may be formed in the substrate 101 through the protection insulating film 103.

Moreover, it is shown that a width of the first trench T1 is uniform in upper and lower portions, but due to characteristics of the dry etching process, the width of the first trench T1 may narrow toward the lower portion. Thus, the sidewall of the first trench T1 may not have the vertical shape and may have a tapered shape with a fine inclination.

Figure 7A:
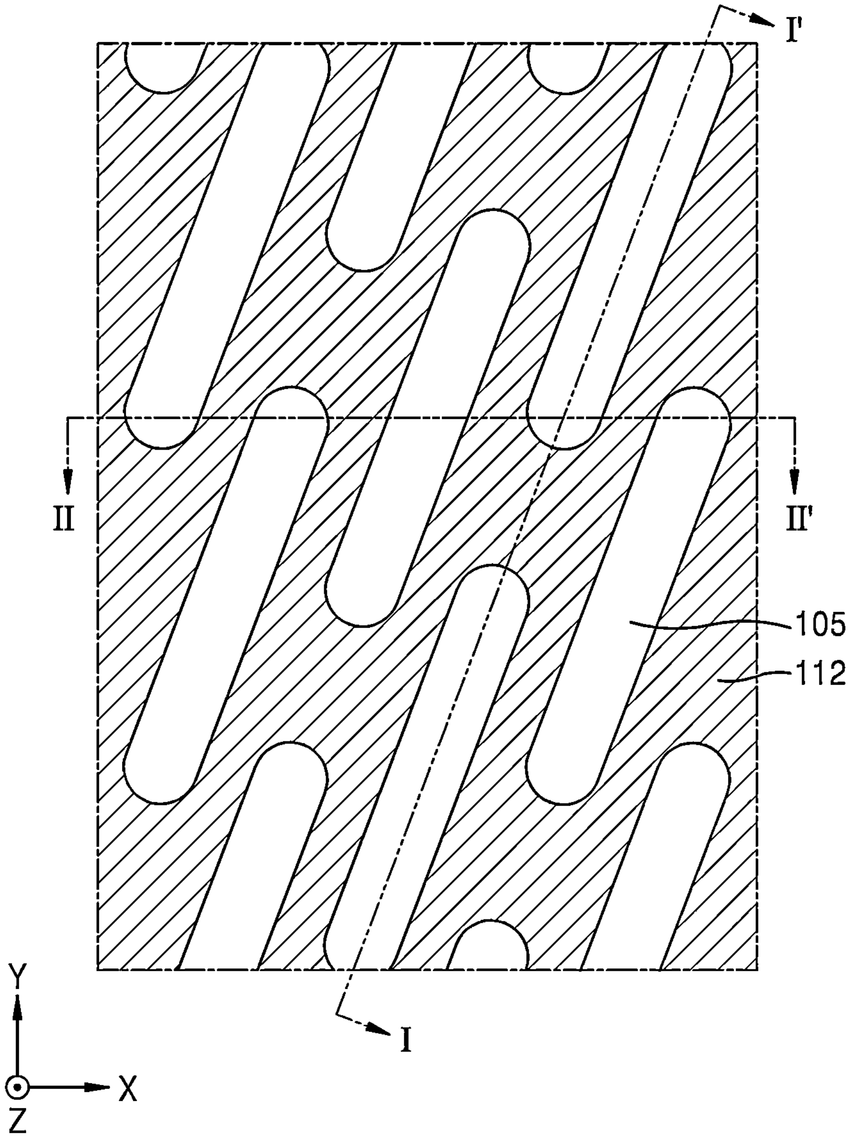
Figure 7B:
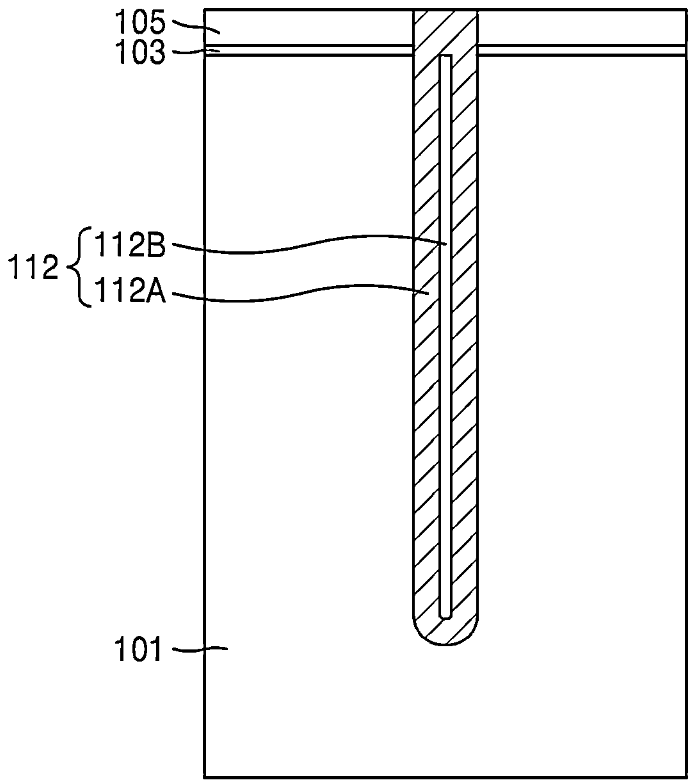
Figure 7C:
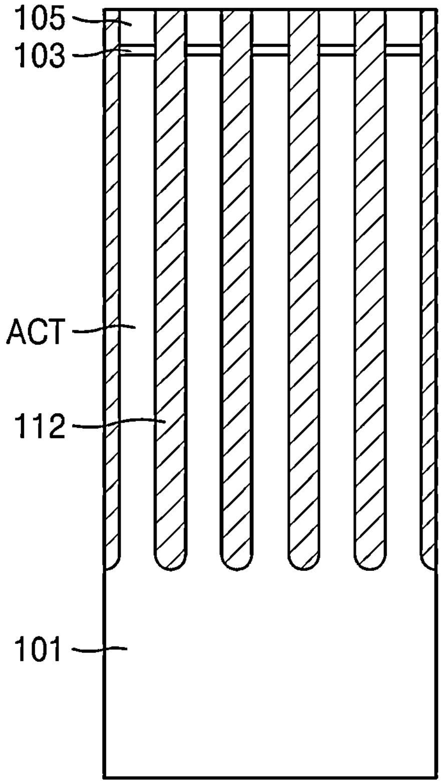

Referring to FIGS. 7A, 7B, and 7C together, the first trench T1 (see FIG. 6B) may be filled with an insulating material to form the trench isolation 112.

The trench isolation 112 may have a structure differing according to the horizontal width of the first trench T1 (see FIG. 6B). For example, the trench isolation 112 may have a first structure including a single insulating film. The trench isolation 112 may have a second structure including a first insulating film 112A and a second insulating film 112B.

Herein, the uppermost surface of the trench isolation 112 may be formed at substantially the same level as the uppermost surface of the first mask 105.

Figure 8A:
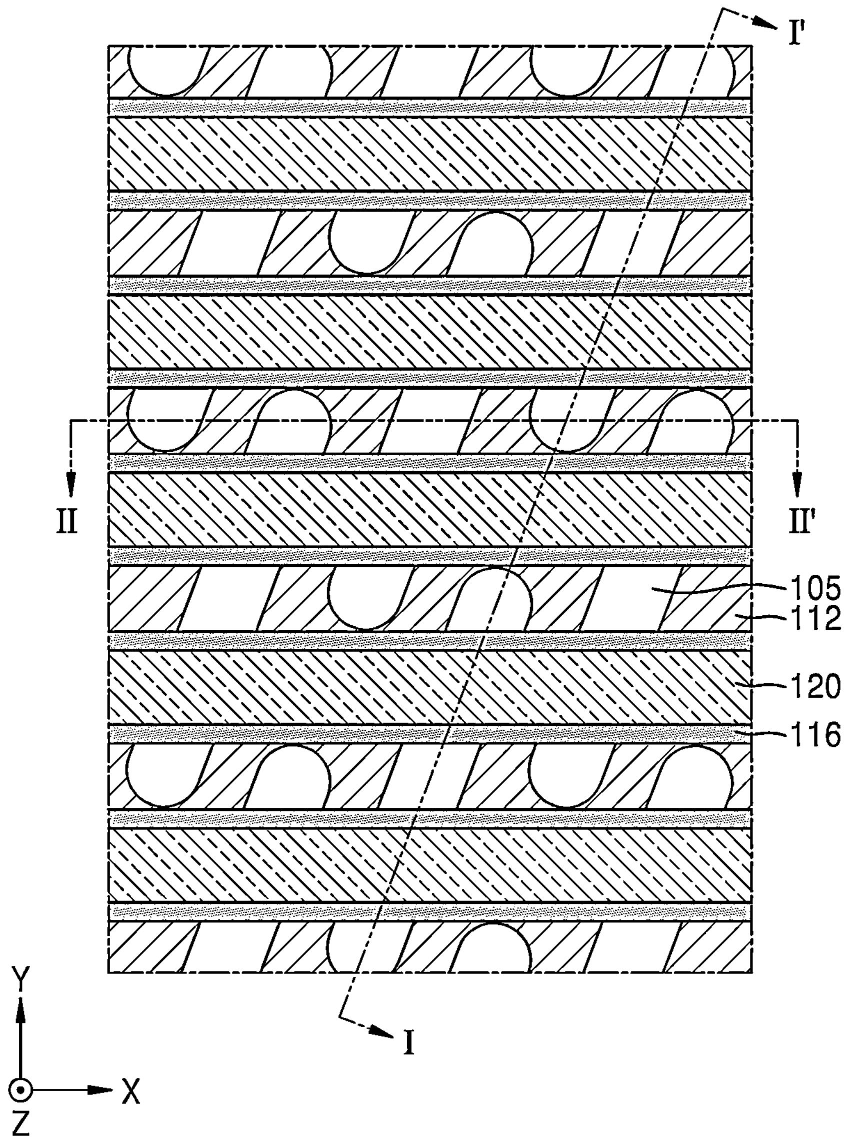
Figure 8B:
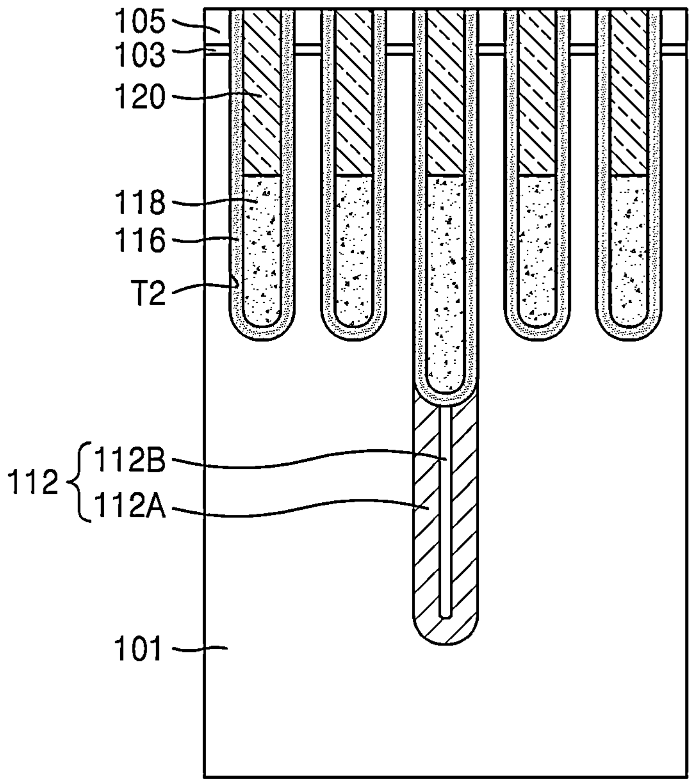
Figure 8C:
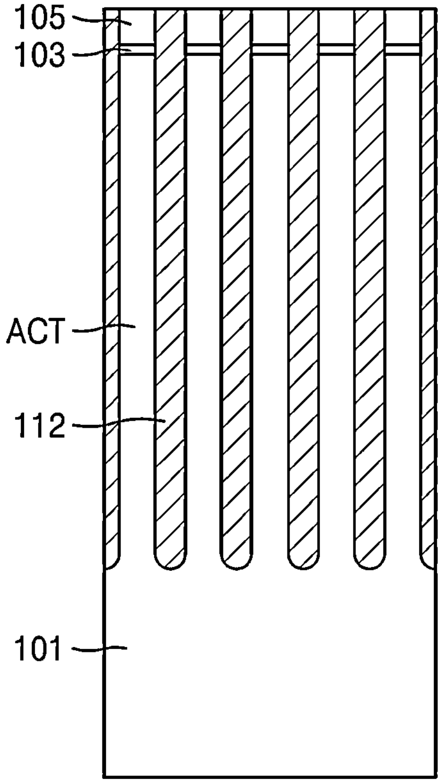

Referring to FIGS. 8A, 8B, and 8C together, a plurality of second trenches T2 may be formed in the substrate 101.

The second trenches T2 may extend in parallel with one another in the first horizontal direction (the X direction) and may be formed across the active region ACT. After a resultant on the substrate 101 where the second trenches T2 are formed is washed, a gate dielectric film 116, a word line 118, and a buried insulating film 120 are sequentially formed inside each of the second trenches T2.

More specifically, after the second trenches T2 are formed, the gate dielectric film 116 may be formed on the whole surface of the substrate 101. Thus, the gate dielectric film 116 may cover an inner wall of the second trench T2. The gate dielectric film 116 may be formed of at least one material selected from among, for example, a silicon oxide, a silicon nitride, a silicon oxynitride, oxide/nitride/oxide (ONO), and/or a high-k dielectric film having a higher dielectric constant than the silicon oxide.

After the gate dielectric film 116 is formed, a conductive film may be filled in a lower portion of the second trench T2 to form the word line 118 of a buried structure. In some embodiments, the top surface of the word line 118 may be lower than the top surface of the substrate 101 or the top surface of the active region ACT. The word line 118 may be formed of at least one material selected from among, for example, Ti, TiN, Ta, TaN, W, WN, TiSiN, and/or WSiN.

After the word line 118 is formed, the upper portion of the second trench T2 may be filled with an insulating material to form the buried insulating film 120. Thus, the buried insulating film 120 may be formed on the word line 118 in the second trench T2. The buried insulating film 120 may be formed of a material having an etching selectivity different from that of the first mask 105.

Herein, the uppermost surface of the buried insulating film 120 may have substantially the same level as the uppermost surface of the first mask 105. Moreover, the uppermost surface of the buried insulating film 120 may have a higher level than the uppermost surface of the active region ACT. By the level of the uppermost surface of the buried insulating film 120, a space for forming the additional pad 110 (see FIG. 13B) may be provided using the buried insulating film 120 in a subsequent process.

In some embodiments, after the word line 118 is formed, impurity ions may be injected into the active region ACT at both sides of the word line 118 to form a source/drain region on the active region ACT. In other embodiments, before the word line 118 is formed, impurity ions for forming the source/drain regions may be injected.

Figure 9A:
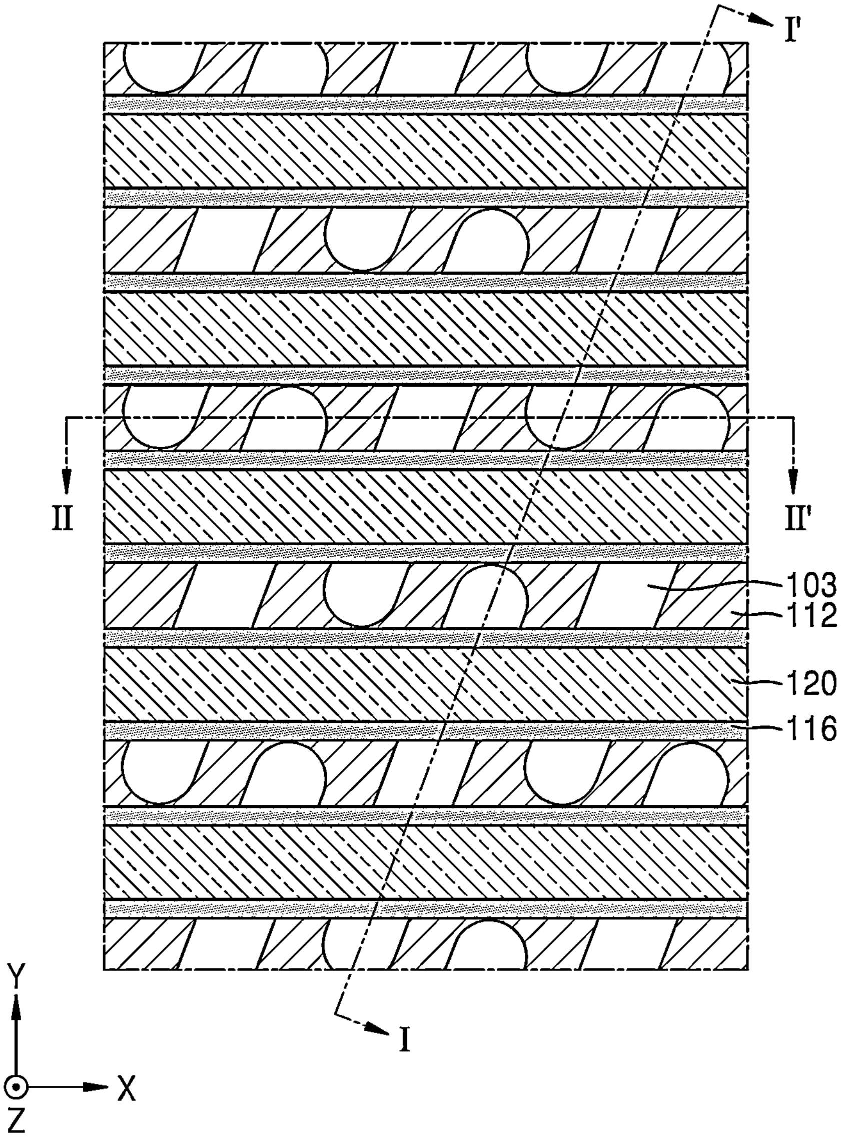
Figure 9B:
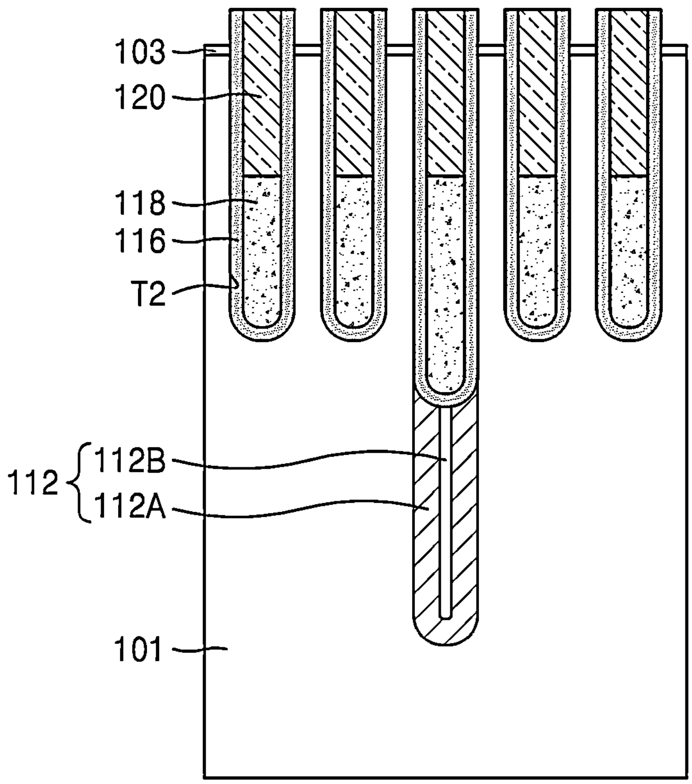
Figure 9C:
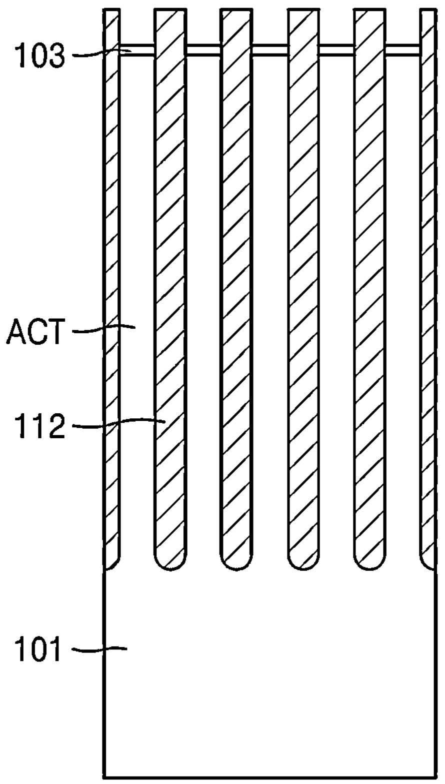

Referring to FIGS. 9A, 9B, and 9C together, the first mask 105 (see FIG. 8B) in an upper portion of the protection insulating film 103 may be completely removed.

The first mask 105 (see FIG. 8B) may be removed through a dry etching process or a wet etching process. When the first mask 105 (see FIG. 8B) is removed, the protection insulating film 103 may serve as an etching stopping film. Moreover, when the first mask 105 (see FIG. 8B) is removed, the gate dielectric film 116 and the buried insulating film 120 may remain without being etched.

Figure 10A:
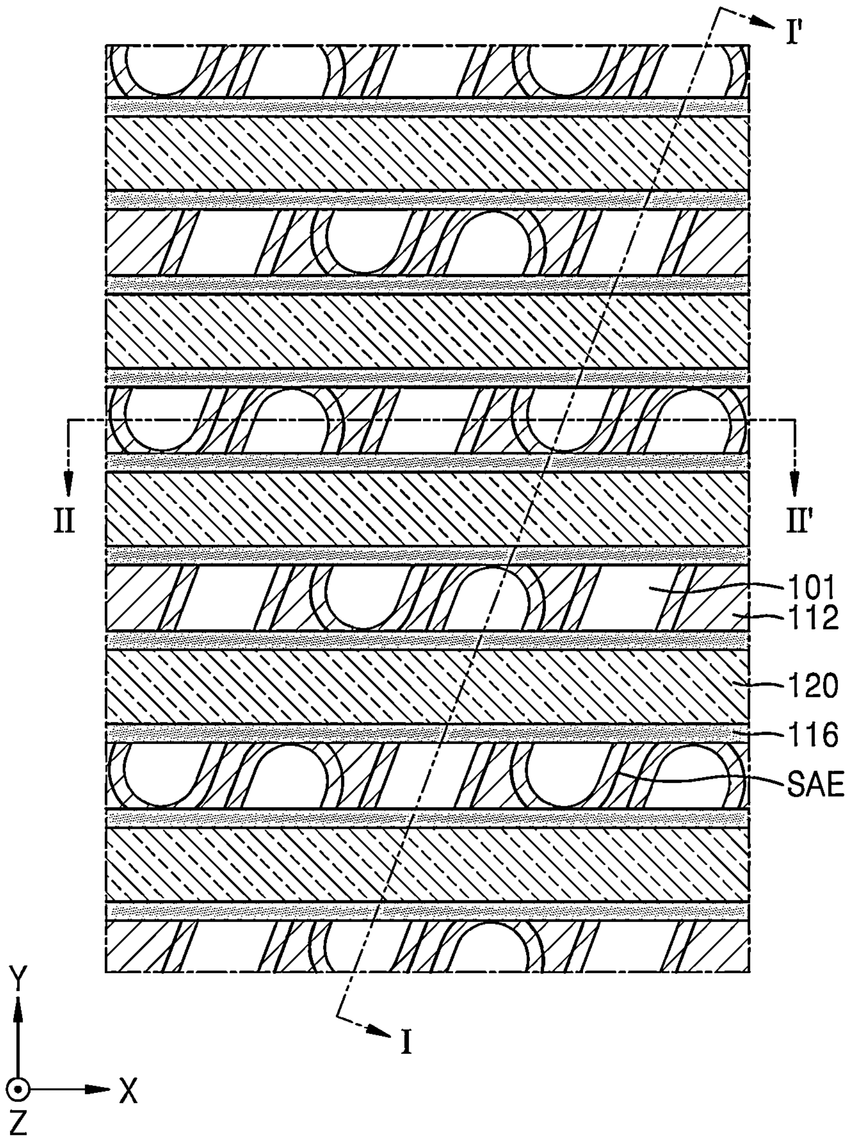
Figure 10B:
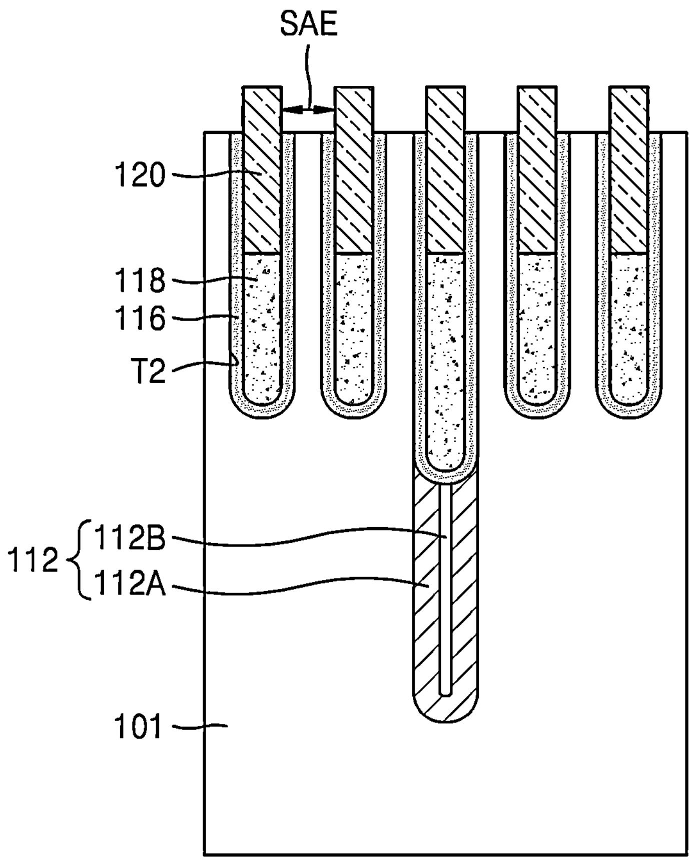
Figure 10C:
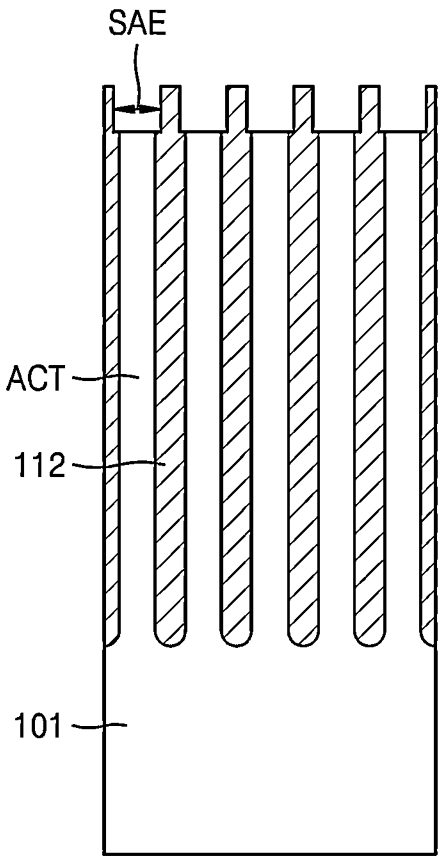

Referring to FIGS. 10A, 10B, and 10C together, all portions of the protection insulating film 103, a portion of the gate dielectric film 116, and a portion of the trench isolation 112 may be removed through a washing process and/or an etching process.

All the portions of the protection insulating film 103 and a portion of the gate dielectric film 116 protruding on the substrate 101 may be removed, such that the uppermost surface of the gate dielectric film 116 may be at substantially the same level as the uppermost surface of the substrate 101.

All the portions of the protection insulating film 103 and a portion of a sidewall of the trench isolation 112 protruding from the substrate 101 may be removed, such that the trench isolation 112 may be formed to have a step on the uppermost surface of the substrate 101.

Through such a washing process and/or an etching process, a self-aligning extension region SAE having a greater horizontal width than the active region ACT may be formed in a region where the first mask 105 (see FIG. 8B) existed before. That is, the self-aligning extension region SAE may be formed on the active region ACT without using a photolithography process. Moreover, due to the washing process, the uppermost surface of the active region ACT may exist in a clean state.

Figure 11A:
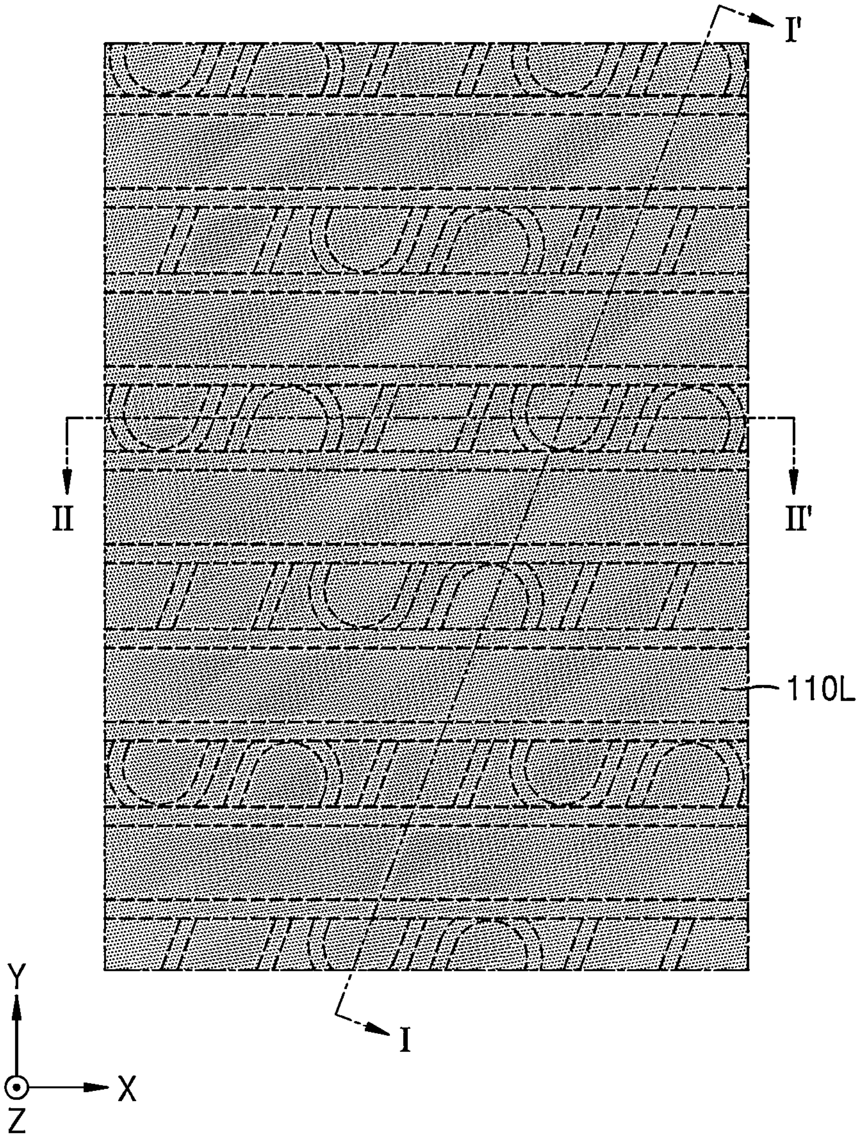
Figure 11B:
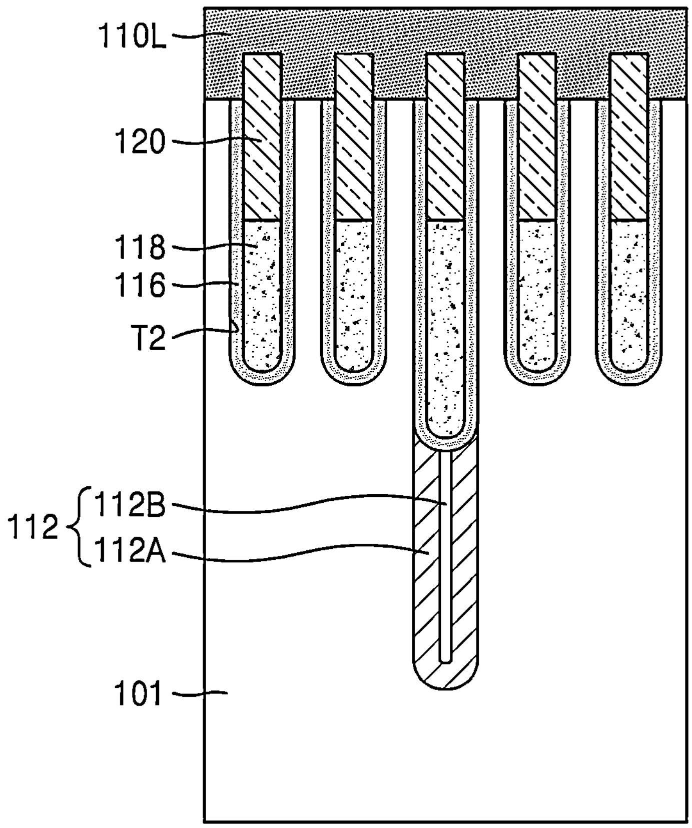
Figure 11C:
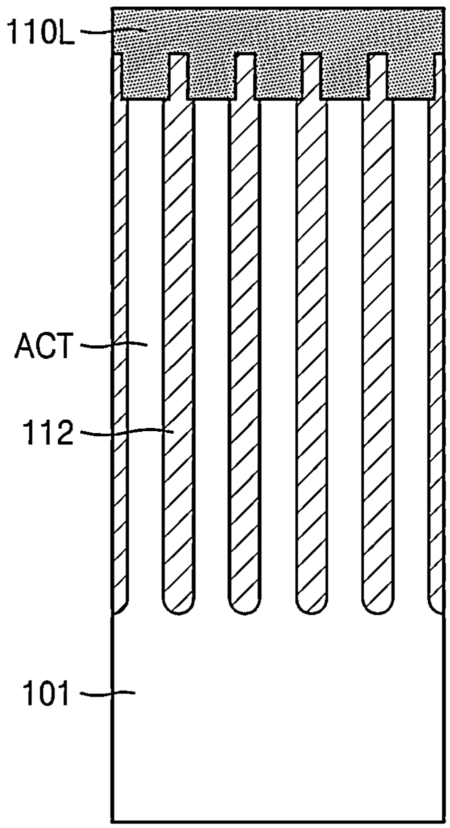

Referring to FIGS. 11A, 11B, and 11C together, a lower pad layer 110L entirely filling the self-aligning extension region SAE may be formed.

The lower pad layer 110L may include doped polysilicon. In some embodiments, the lower pad layer 110L may be formed to fill a space between the buried insulating films 120 and a space between the trench isolations 112 on the substrate 101, such that the bottom surface of the lower pad layer 110L may be formed as an uneven surface.

Meanwhile, the lower pad layer 110L is formed on the whole surface of the substrate 101, such that components under the lower pad layer 110L are not shown because of being covered with the lower pad layer 110L in FIG. 11A, but they are indicated by dashed lines for convenience of description.

Figure 12A:
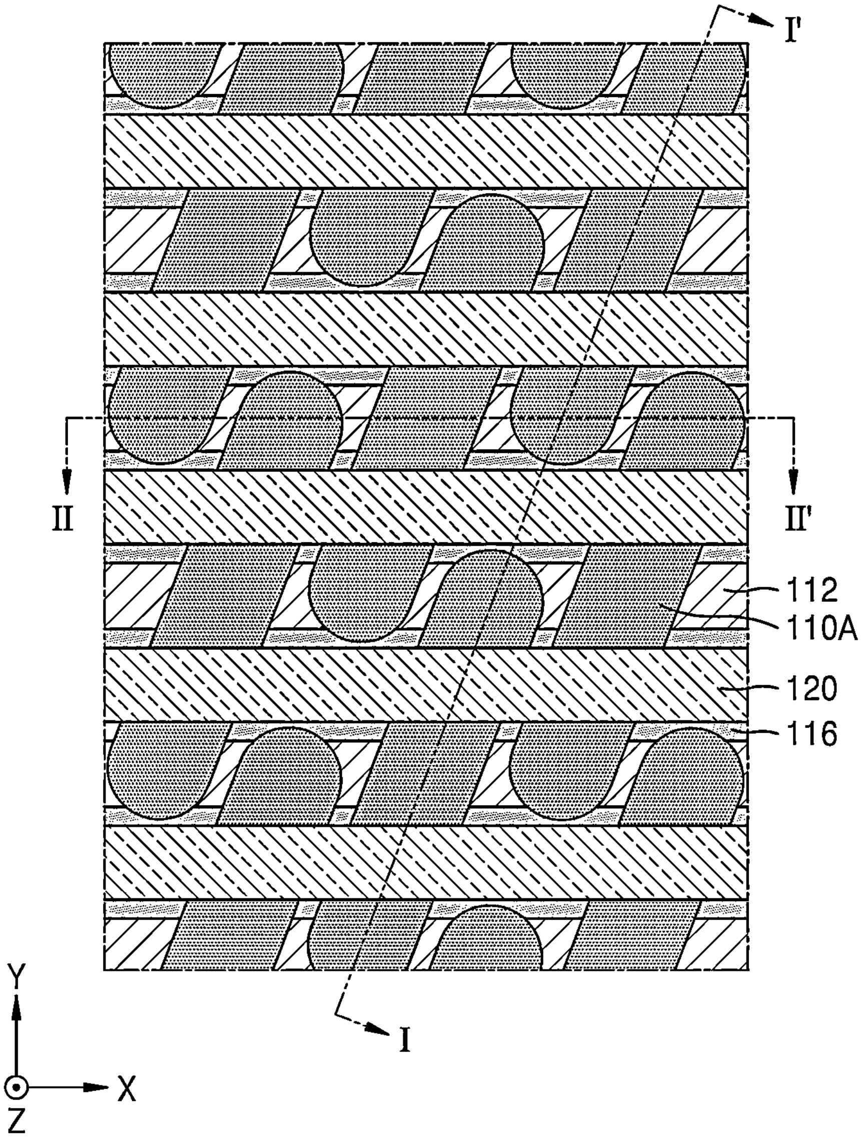
Figure 12B:
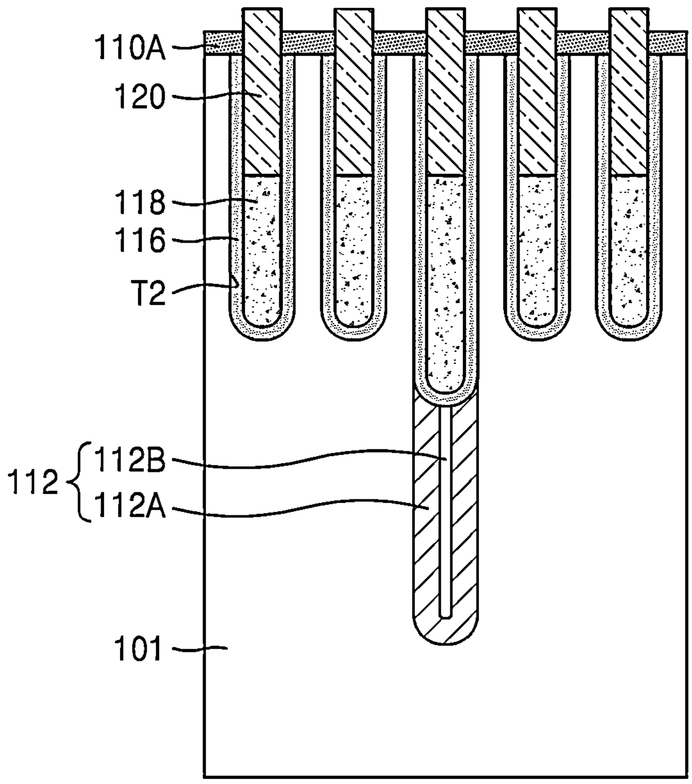
Figure 12C:
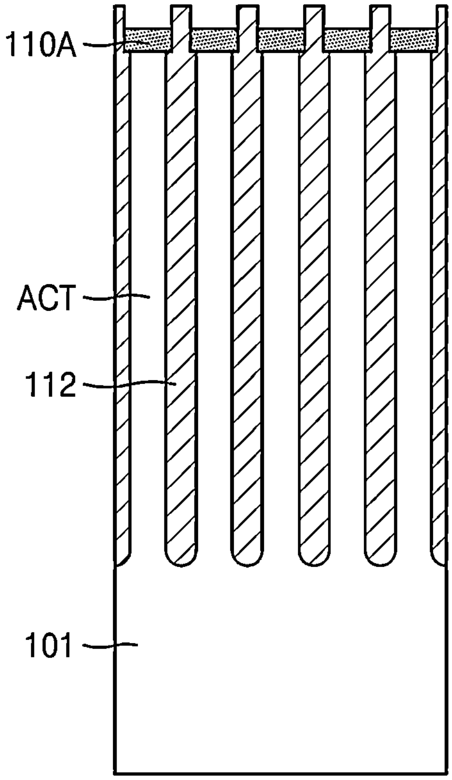

Referring to FIGS. 12A, 12B, and 12C together, the lower pad 110A that fills a lower portion of the self-aligning extension region SAE and covers the top surface of the active region ACT may be formed through a node separating process.

The node separating process may refer to a separating process to form a plurality of lower pads 110A in the plurality of active regions ACT by performing an etch-back process with respect to the lower pad layer 110L (see FIG. 11B).

Thus, the lower pad 110A having a greater horizontal width than the active region ACT while filling the lower portion of the self-aligning extension region SAE on the active region ACT may be formed in the self-aligning manner. In addition, the lower pads 110A may be arranged to be spaced apart from one another at opposite ends of the active region ACT in the shape of a bar. A sidewall of the lower pad 110A may be formed to contact the buried insulating film 120 and the trench isolation 112.

Figure 13A:
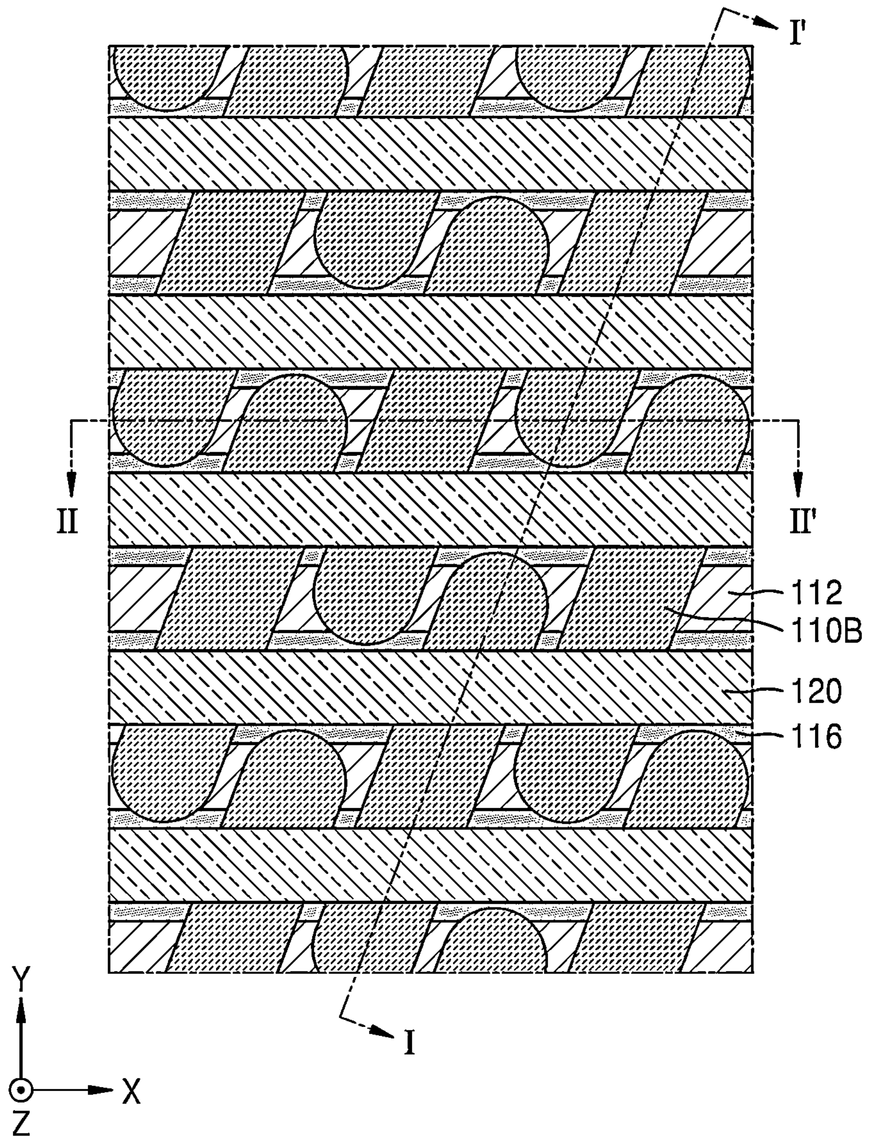
Figure 13B:
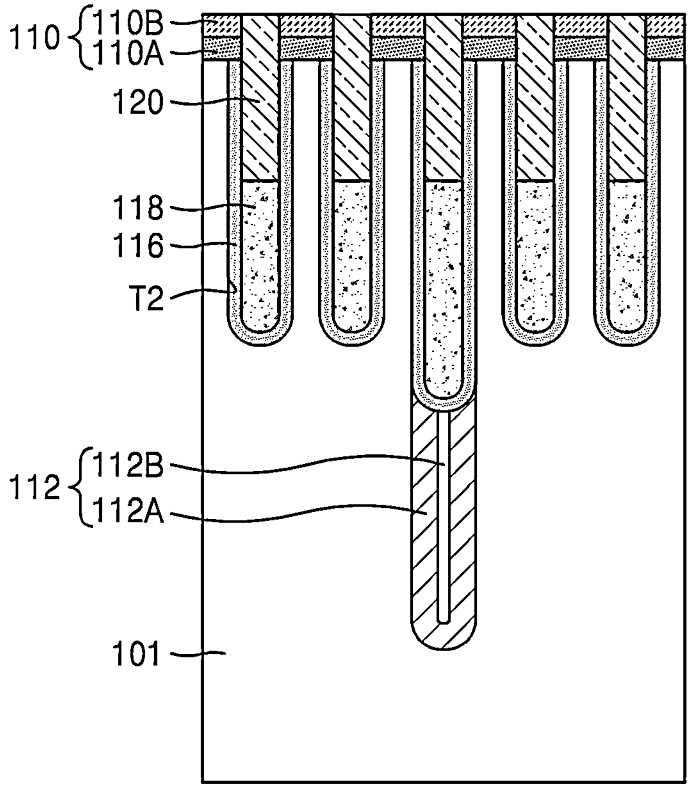
Figure 13C:
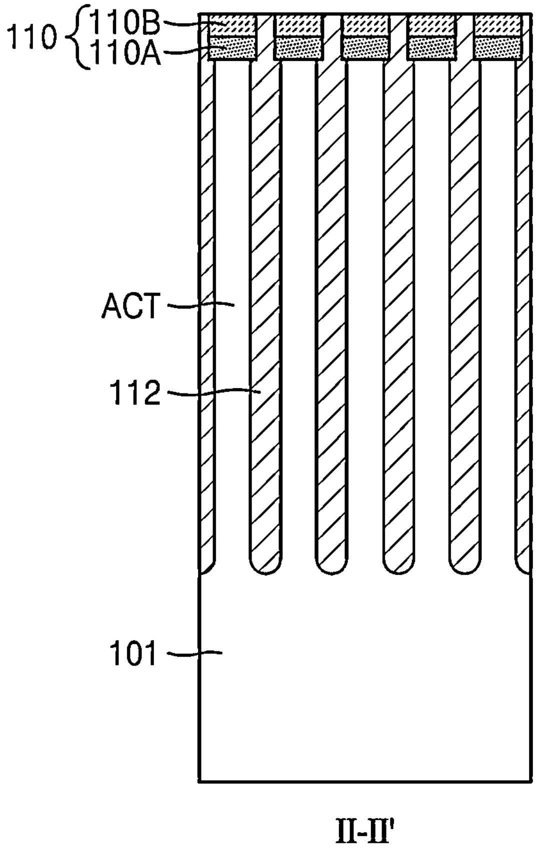

Referring to FIGS. 13A, 13B, and 13C together, by using substantially the same process as a process of forming the lower pad 110A, an upper pad 110B that fills an upper portion of the self-aligning extension region SAE and covers the top surface of the lower pad 110A may be formed.

The upper pad 110B in the same shape as the lower pad 110A may be formed on the lower pad 110A. The upper pad 110B may include metal unlike the lower pad 110A. The uppermost surface of the upper pad 110B may be at substantially the same level as the uppermost surface of the buried insulating film 120 and the uppermost surface of the trench isolation 112.

Thus, the additional pad 110 including the lower pad 110A and the upper pad 110B may be formed. That is, the additional pad 110 having a greater horizontal width than the active region ACT while filling the entire self-aligning extension region SAE on the active region ACT may be formed in the self-aligning manner.

In addition, the additional pads 110 may be arranged to be spaced apart from each other at opposite ends of the active region ACT in the shape of a bar. A sidewall of the additional pad 110 may be formed to contact the buried insulating film 120 and the trench isolation 112.

Figure 14A:
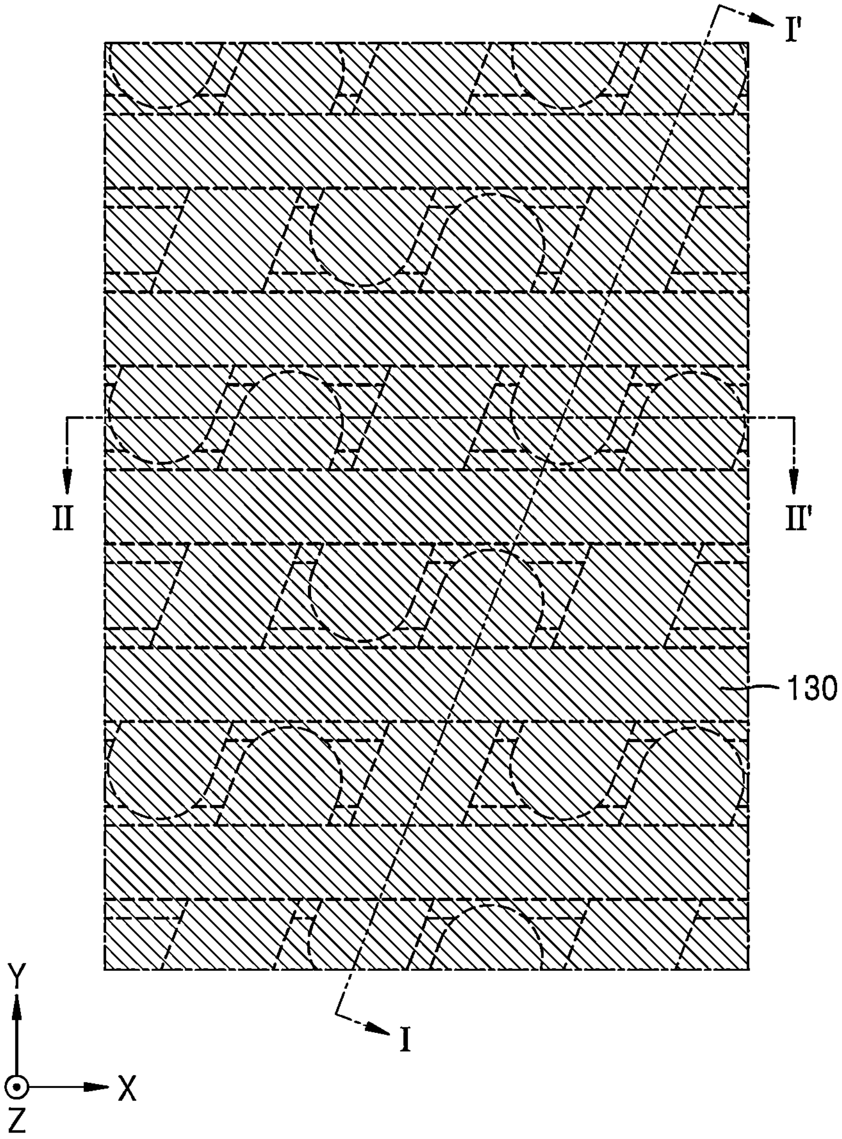
Figure 14B:
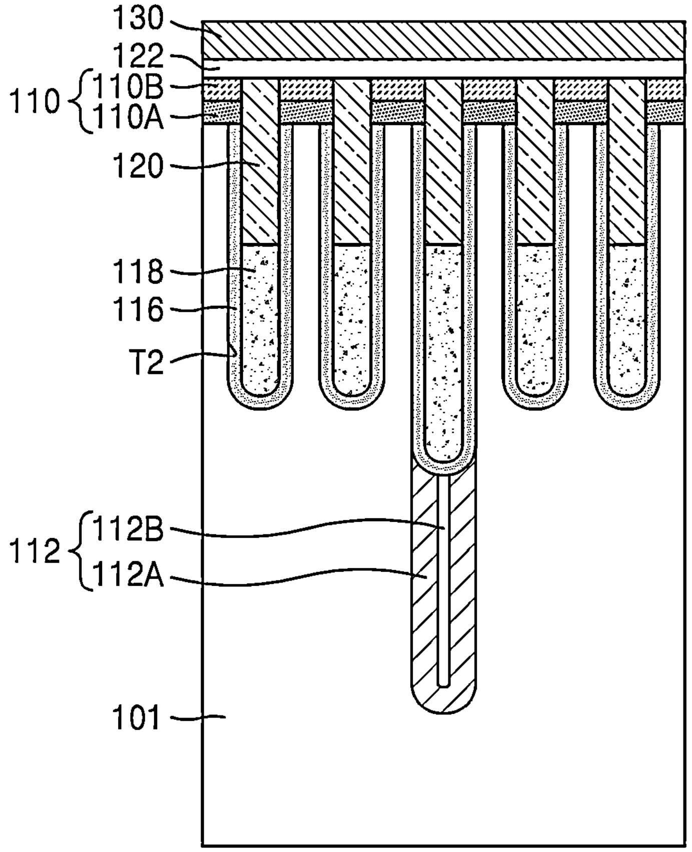
Figure 14C:
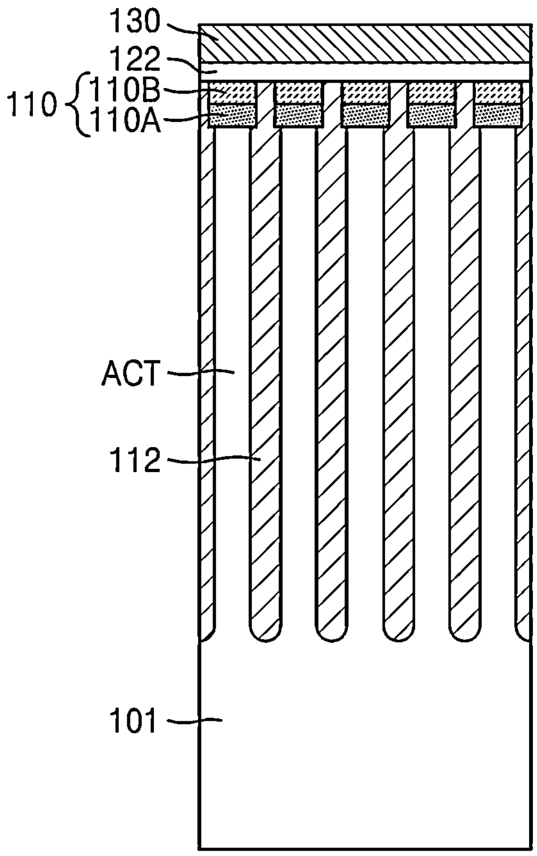

Referring to FIGS. 14A, 14B, and 14C together, the buffer layer 122 and the lower conductive layer 130 may be sequentially formed on the whole surface of the substrate 101.

The buffer layer 122 may be formed to cover the top surfaces of the plurality of additional pads 110, the top surface of the trench isolation 112, and the top surfaces of the plurality of buried insulating films 120. To form the buffer layer 122, a first silicon oxide, a silicon nitride, and a second silicon oxide, without being limited thereto, may be sequentially formed on the substrate 101.

The lower conductive layer 130 may be formed on the buffer layer 122. The lower conductive layer 130 may include, but is not limited to, doped polysilicon.

Meanwhile, the lower conductive layer 130 may be formed on the whole surface of the substrate 101, such that components under the lower conductive layer 130 are not shown because of being covered with the lower conductive layer 130 in FIG. 14A, but they are indicated by dashed lines for convenience of description.

Figure 15A:
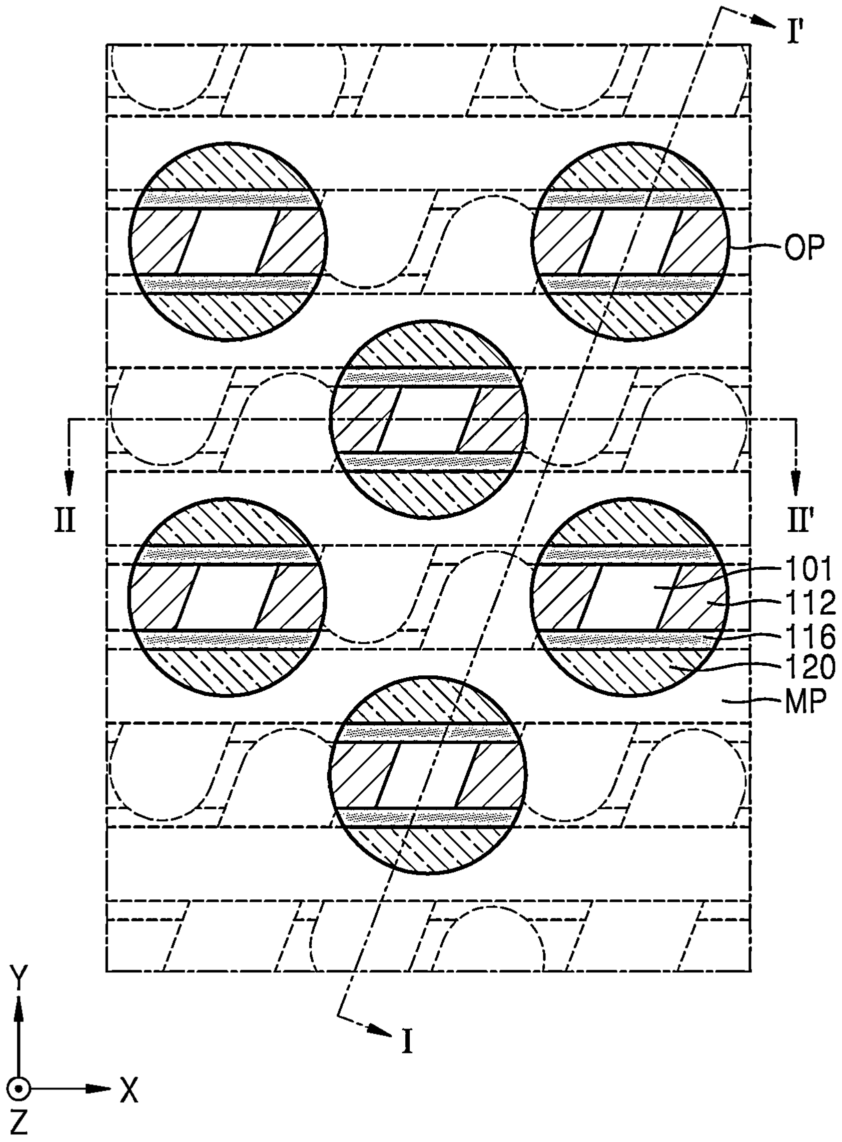
Figure 15B:
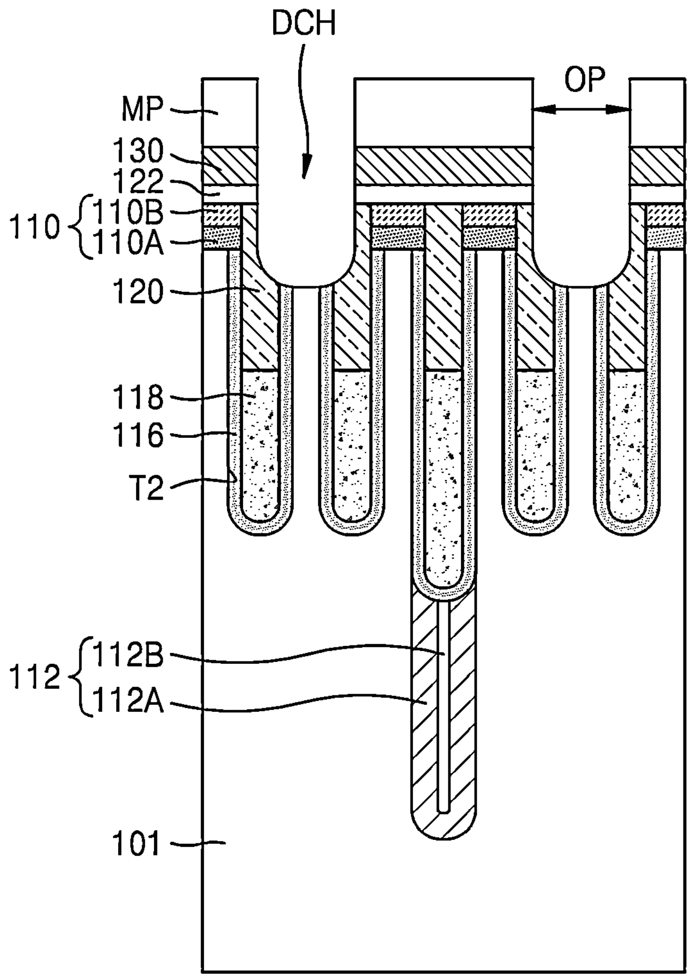
Figure 15C:
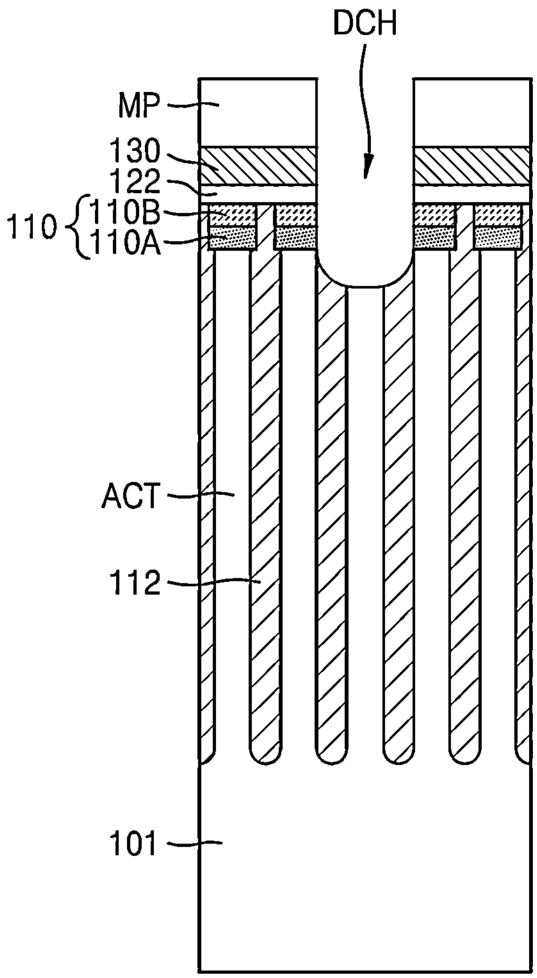

Referring to FIGS. 15A, 15B, and 15C together, a mask pattern MP may be formed on the lower conductive layer 130 through photolithography.

The mask pattern MP may be formed of a material that is easily removed through an ashing and stripping process. For example, the mask pattern MP may be formed of photoresist or a material having a large amount of carbon like a spin-on-hard mask (SOH).

The mask pattern MP may include an open region OP that exposes a portion corresponding to the center portion of the active region ACT. The center portion of the active region ACT exposed through the open region OP may correspond to a portion where the direct contact DC (see FIG. 2) is to be formed.

By etching the lower conductive layer 130 exposed through the open region OP and etching a portion of each of the substrate 101, the trench isolation 112, the gate dielectric film 116, and the additional pad 110 using the mask pattern MP as an etching mask, a direct contact hole DCH exposing the active region ACT of the substrate 101 may be formed.

Meanwhile, according to the form of an open region of the mask pattern MP, the shape of the direct contact hole DCH and the form of the additional pad 110 may be changed variously. That is, a portion of a sidewall of the additional pad 110 may be removed by the direct contact hole DCH, such that the shape of the additional pad 110 may be defined by the direct contact hole DCH.

A subsequent process of manufacturing the integrated circuit device 10 would be understood by those of ordinary skill in the art and thus will not be described in detail.

Referring back to FIG. 2, by including the additional pad 110 formed in the self-aligning manner on the active region ACT, the integrated circuit device 10 according to some embodiments of the inventive concept may secure a contact area between the buried contact BC and the active region ACT, thereby maintaining production efficiency and stable operation performance.

Figure 16:
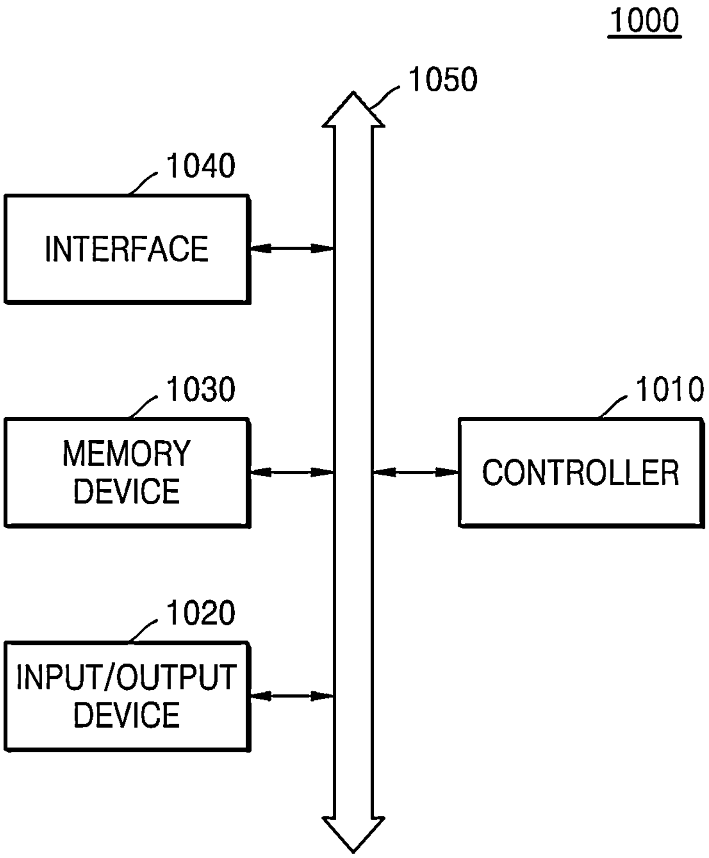
FIG. 16 is a structural view showing a system including an integrated circuit device, according to some example embodiments of the inventive concept.

FIG. 16 is a structural view showing a system including an integrated circuit device, according to some example embodiments of the inventive concept.

Referring to FIG. 16, a system 1000 may include a controller 1010, an input/output device 1020, a memory device 1030, an interface 1040, and a bus 1050.

The system 1000 may be a mobile system or a system that transmits or receives information. In some embodiments, the mobile system may be a portable computer, a web tablet, a mobile phone, a digital music player, or a memory card.

The controller 1010 may control an execution program in the system 1000, and may include a microprocessor, a digital signal processor, a microcontroller, or a similar device thereof.

The input/output device 1020 may be used to input or output data of the system 1000. The system 1000 may be connected to an external device, e.g., a personal computer or a network, and may exchange data with the external device, by using the input/output device 1020. The input/output device 1020 may be, for example, a touch screen, a touch pad, a keyboard, or a display.

The memory device 1030 may store data for an operation of the controller 1010 or store data processed by the controller 1010. The memory device 1030 may include any one of the integrated circuit devices 10, 20, and 30 according to embodiments of the inventive concept described above.

The interface 1040 may be a data transmission path between the system 1000 and the external device. The controller 1010, the input/output device 1020, the memory device 1030, and the interface 1040 may communicate with one another through the bus 1050.

While aspects of the inventive concept have been particularly shown and described with reference to embodiments thereof, it will be understood that various changes in form and details may be made therein without departing from the scope of the following claims.

What is claimed is:

1. An integrated circuit device comprising:

a substrate that comprises an active region defined by a trench isolation;

a word line that extends in a first horizontal direction inside the substrate across the active region;

a bit line that extends on the word line in a second horizontal direction orthogonal to the first horizontal direction;

a direct contact that electrically connects the bit line to the active region;

a first pad that is on the active region and has a horizontal width that is greater than that of the active region;

a buried contact that contacts a sidewall of the pad; and a conductive landing pad that extends on the buried contact in a vertical direction and faces the bit line in the first horizontal direction, wherein the first pad and a second pad are separated by the trench isolation positioned therebetween along the first horizontal direction.

2. The integrated circuit device of claim 1, wherein the sidewall of the first pad is a first sidewall and at least a portion of the first sidewall has a round shape, and a second sidewall of the first pad opposing the first sidewall has a linear shape.

3. The integrated circuit device of claim 2, wherein the round shape of at least the portion of the first sidewall of the first pad is concave.

4. The integrated circuit device of claim 1, further comprising an insulating pattern on opposing sidewalls of the direct contact, wherein the insulating pattern contacts the sidewall of the first pad.

5. The integrated circuit device of claim 1, wherein a level of a lowermost surface of the buried contact is higher than a level of a lowermost surface of the first pad in the vertical direction relative to the substrate, and the level of the lowermost surface of the buried contact is lower than a level of an uppermost surface of the first pad in the vertical direction relative to the substrate.

6. The integrated circuit device of claim 5, wherein the level of the lowermost surface of the buried contact is higher than a level of an uppermost surface of the active region in the vertical direction relative to the substrate, and the level of the lowermost surface of the buried contact is lower than a level of an uppermost surface of the trench isolation in the vertical direction relative to the substrate.

7. The integrated circuit device of claim 1, wherein the first pad comprises a single-layer structure comprising doped polysilicon, and the buried contact comprises a material that is the same as a material of the first pad.

8. The integrated circuit device of claim 1, wherein the first pad comprises a lower pad comprising doped polysilicon and an upper pad comprising metal on the lower pad, and the buried contact directly contacts the upper pad and comprises a material that is the same as a material of the upper pad.

9. The integrated circuit device of claim 8, wherein the first pad further comprises a metal silicide film between the lower pad and the upper pad, and the buried contact further comprises a metal silicide film on a surface that contacts the upper pad.

10. The integrated circuit device of claim 1, wherein, in a plan view, the active region has a bar shape that extends in a diagonal direction with respect to the first horizontal direction and the second horizontal direction, the substrate further comprises a second active region defined by the trench isolation, the second pad is on the second active region, and the first pad is spaced apart from the second pad at an end of the bar shape.

11. An integrated circuit device comprising:

a substrate that comprises an active region defined by a trench isolation;

a first pad that is on the active region and has a horizontal width that is different from that of the active region;

a word line that extends in a first horizontal direction inside the substrate across the active region;

a bit line that extends on the word line in a second horizontal direction orthogonal to the first horizontal direction;

a direct contact that electrically connects the bit line to the active region;

a conductive landing pad that faces the bit line in the first horizontal direction;

a capacitor structure on the bit line and electrically connected to the conductive landing pad; and a buried contact that contacts a sidewall of the first pad such that the capacitor structure is electrically connected to the active region, wherein the first pad and a second pad are separated by the trench isolation positioned therebetween along the first horizontal direction.

12. The integrated circuit device of claim 11, wherein a horizontal width of the first pad is greater than a horizontal width of the active region, the sidewall of the first pad is a first sidewall and at least a portion of the first sidewall has a round shape, and a second sidewall of the first pad opposing the first sidewall has a linear shape.

13. The integrated circuit device of claim 12, further comprising an insulating pattern on opposing sidewalls of the direct contact, wherein the insulating pattern contacts the first sidewall of the first pad.

* * * * *